US005905740A

United States Patent [19]
Williamson

[11] Patent Number: 5,905,740
[45] Date of Patent: May 18, 1999

[54] APPARATUS AND METHOD FOR ERROR CORRECTION

[75] Inventor: Clifton J. Williamson, Soquel, Calif.

[73] Assignee: Seagate Technology, Inc., Scotts Valley, Calif.

[21] Appl. No.: 08/841,942

[22] Filed: Apr. 8, 1997

[51] Int. Cl.$^6$ .................................................. G06F 11/00
[52] U.S. Cl. .......................................................... 371/37.11
[58] Field of Search ............................. 371/37.11, 37.07, 371/43.01, 44, 45, 38.1, 39.1

[56] References Cited

U.S. PATENT DOCUMENTS

| | | | |
|---|---|---|---|
| 4,162,482 | 7/1979 | Berlekamp | 340/146.1 |
| 5,099,482 | 3/1992 | Cameron | 371/37.1 |
| 5,241,546 | 8/1993 | Peterson et al. | 371/37.1 |
| 5,329,534 | 7/1994 | Cucchi et al. | 371/37.1 |
| 5,373,511 | 12/1994 | Veksler | 371/37.4 |
| 5,422,895 | 6/1995 | Nguyen et al. | 371/37.5 |
| 5,442,578 | 8/1995 | Hattori | 364/746.1 |
| 5,446,745 | 8/1995 | Gibbs | 371/37.7 |

OTHER PUBLICATIONS

Clark, G.C. and Cain, J.B., Excerpt from *Error–Correction Coding for Digital Communications,* 1981 Plenum Press, New York, pp. 181–208.

*Primary Examiner*—Vincent P. Canney
*Attorney, Agent, or Firm*—Flehr Hohbach Test Albritton & Herbert LLP

[57] ABSTRACT

The present invention pertains to an apparatus and method for determining at most four error locations of RS encoded data read from a storage medium. The error location polynomial solver includes a controller, a multiplexer, storage registers, a data flow control unit, and various GF(256) arithmetic units. The GF(256) arithmetic units include GF(256) multiply unit, a GF(256) logarithmic ROM, a GF(256) anti-logarithmic ROM, a GF(256) square root unit, a GF(256) quadratic root finder, and a specialized integer division unit. The controller directs the operation of each of these components to perform one or more equation solver procedures that determine the appropriate number of roots. In an embodiment of the present invention, the controller is implemented as a state machine. The controller receives four coefficients representing an error location polynomial. The degree of the error location polynomial is determined in order for the controller to execute an appropriate equation solver procedure. The controller can execute one of four equation solver procedures based on the degree of the received error location polynomial.

20 Claims, 13 Drawing Sheets

APPARATUS AND METHOD FOR ERROR CORRECTION

The present invention relates generally to error correction. More particularly, the invention relates to such a system using Reed-Solomon encoding/decoding techniques.

BACKGROUND OF THE INVENTION

Since a storage medium is subject to various types of noise, distortion and interference, various errors can occur at the output of the storage medium. The current trend is to store greater amounts of digital data in smaller areas on the storage medium. This trend increases the probability of errors. To correct the errors, error correction coding is used. One class of such error correction codes is the well-known Reed Solomon (RS) codes.

The Reed Solomon (RS) encoding technique appends to each block of k user data symbols 2t redundancy symbols to create a codeword (where t represents the designed symbol error correcting capacity of the code). There are k+2t symbols in a RS codeword. The RS code views the n-bit symbols as elements of a Galois Field ($GF(2^n)$). A Galois field is a finite field, the elements of which may be represented as polynomials in a, where a is a root of an irreducible polynomial of degree n. The RS codeword consists of a block of n-bit symbols. Typically, n=8 and the 8-bit symbols are referred to as bytes. Constructing the Galois field $GF(2^n)$ requires a defining polynomial f(x) of degree n. In addition, a primitive element $\beta$ is chosen so that every nonzero element of $GF(2^n)$ is a power of $\beta$. The element $\beta$ is not necessarily a root of f(x).

A RS codeword C is viewed as a polynomial C(x) and the redundancy symbols are chosen so that the roots of C(x) include the roots of a generator polynomial G(x) whose roots are 2t consecutive powers of $\beta$. The k user data symbols are viewed as the high order coefficients of a degree k+2t−1 polynomial, and the redundancy symbols are the coefficients of the remainder when this polynomial is divided by G(x).

The process of corrupting the original code block C(x) with errors can be viewed as adding an error polynomial E(x) to C(x). The resultant corrupted polynomial is known as the received polynomial R(x), where R(x)=C(x)+E(x).

The v non-zero terms of the error polynomial contain the necessary information to completely reconstruct the original data C(x), since each term corresponds to a symbol error location and magnitude. The error correction procedure is to reconstruct the error polynomial E(x). Three polynomials are used to correct a received polynomial R(x): S(x), a syndrome polynomial; $\Lambda(x)$, an error locator (or error location) polynomial; and $\Omega(x)$ an error magnitude polynomial. The syndromes are computed by evaluating the polynomial R(x) at all roots of G(x). These values are called syndromes and the syndrome polynomial S(x) has these values as coefficients. The syndrome polynomial S(x) is used to determine the existence of errors. The error locator polynomial $\Lambda(x)$ and the error magnitude polynomial $\Omega(x)$ are computed from S(x) by a key equation solver. The roots of the error locator polynomial $\Lambda(x)$ indicate positions in the data that are erroneous and both the error locator polynomial $\Lambda(x)$ and the error magnitude polynomial $\Omega(x)$ are used to determine the true values of the erroneous data.

FIG. 1 illustrates a typical RS decoder unit 100 that is used to determine the error locations and error values. The RS decoder unit 100 comprises a syndrome generator 102, a key equation solver 104, and a Chien search unit 108 for determining the error locations and values. The syndrome generator 102 calculates one syndrome for each of the 2t roots of G(x). The key equation solver 104 utilizes the syndromes to determine the coefficients of the error location polynomial $\Lambda(x)$ and the coefficients of the error magnitude polynomial $\Omega(x)$. The Chien search unit 108 utilizes the error location polynomial $\Lambda(x)$ to search for the roots of the error locator polynomial, $r_1, \ldots, r_v$. The Chien search unit 108 is a root finding technique which involves evaluating the error locator polynomial at all elements in the field $GF(2^n)$. The roots of the error locator polynomial $r_1, \ldots, r_v$ determine the error locations. The error values are then determined using Forney's algorithm 110. The user data is then corrected using the output of the Forney algorithm unit 110 and the received polynomial R(x) which is transmitted by delay unit 106.

The prior art decoder unit 100 entails a three stage approach with each stage utilizing its own circuitry to perform an intended function. In the first stage, the syndromes are calculated utilizing the circuitry of the syndrome generator 102. The second stage entails determining the coefficients of the error locator and error magnitude polynomials which are performed using the circuitry of the key equation solver 104. The third stage 105 entails the determination of the error location and error values which is performed using the Chien search unit 108 and the Forney's algorithm unit 110.

The Chien search technique is advantageous in that it performs an exhaustive search which can accommodate any number of roots. However, for small values of t, a substantial reduction in the size of the circuitry required to determine the error positions can be achieved by utilizing a different technique. The reduction in circuitry has the consequent advantage of reduced cost and time that cannot be achieved using the Chien search technique and the three stage approach used to implement it.

SUMMARY OF THE INVENTION

The present invention pertains to an apparatus and method for determining up to four error locations of RS encoded data read from a storage medium. An error location polynomial is received by an error location polynomial solver that determines the roots of the error location polynomial. The roots determine the error positions.

The error location polynomial solver includes a controller, a multiplexer, storage registers, a data flow control unit, and various GF(256) arithmetic units. The GF(256) arithmetic units include several GF(256) multiply units, a GF(256) logarithmic ROM, a GF(256) anti-logarithmic ROM, a GF(256) square root unit, a GF(256) quadratic root finder, and a specialized unit for dividing integers by three. The controller directs the operation of each of these components to perform one or more equation solver procedures that determine the appropriate number of roots. In an embodiment of the present invention, the controller is implemented as a state machine. A multiplexer is coupled to the storage registers and the GF(256) arithmetic units. The multiplexer, under the direction of the controller, is used to transmit data stored in the storage registers to the GF(256) arithmetic units. The data flow control unit, under the instruction of the controller, directs the outputs of the GF(256) arithmetic units to an intended storage register.

The controller receives four coefficients representing an error location polynomial. The degree of the error location polynomial is determined in order for the controller to execute an appropriate equation solver procedure. The controller can execute one of four equation solver procedures based on the degree of the received error location polynomial.

Each of the equation solver procedures utilize a reciprocal and/or n-th root procedure that relies on GF(256) logarithmic and anti-logarithmic lookup tables. In addition, the n-th root procedure utilizes a specialized division unit. The implementation of the reciprocal and n-th root procedures with these mechanisms enables the error location polynomial solver to utilize less circuitry.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Mathematical Overview

Introduction

Figure 1:
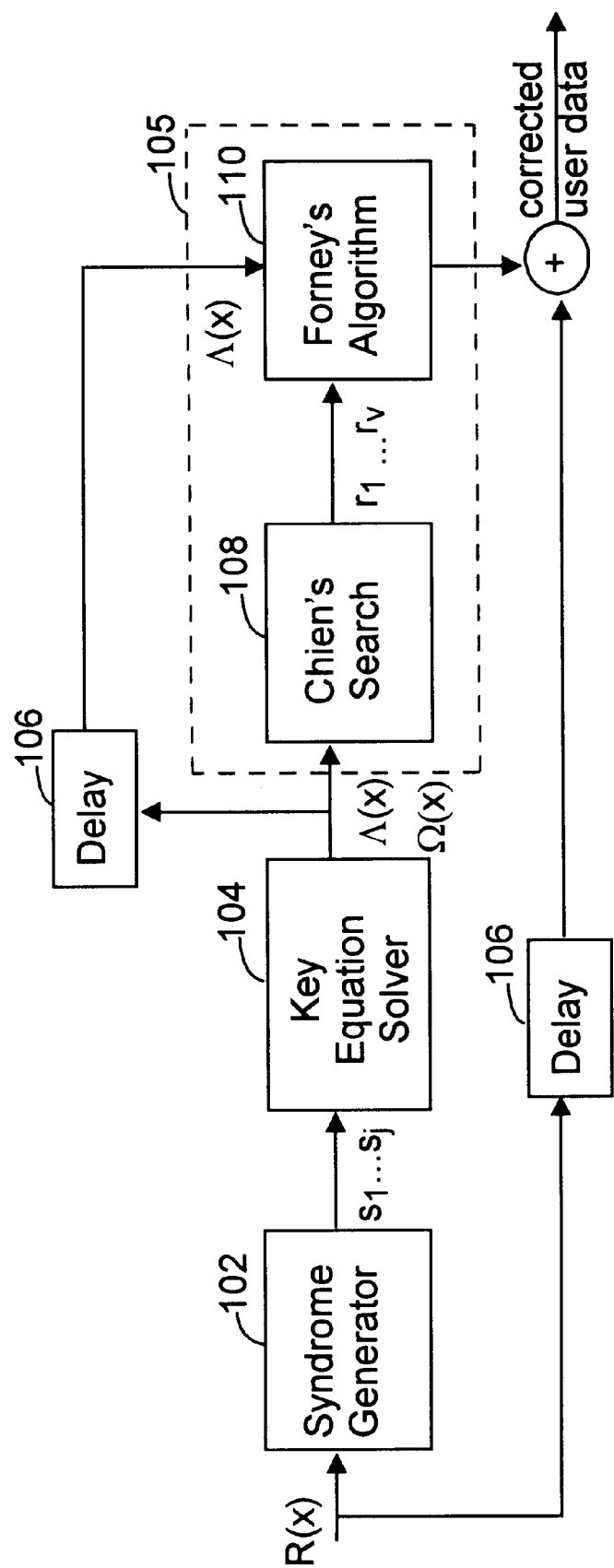
FIG. 1 is a block diagram of a prior art error correction system.

The present invention pertains to an apparatus and method for correcting at most four errors from RS coded data signals. The data is encoded in accordance with a GF ($2^8$) generated by the defining polynomial $x^8+x^7+x^3+x^2+1$. During a decoding process, the error locations are calculated by determining the roots of an error location polynomial. A goal of the error location polynomial solver of the present invention is to determine these roots or determine that such roots do not exist. When the roots do not exist, it has been determined that more than four errors have occurred. The error location polynomial solver starts out by determining the degree of the error location polynomial $\Lambda(x)$. The degree of the error location polynomial indicates the number of roots that the solver needs to calculate.

A first degree error location polynomial is a trivial case which involves returning a coefficient of the error location polynomial. For a second degree error location polynomial, a degree 2 GF(256) equation solver is employed to determine two roots. The roots of a third degree error location polynomial are determined using a degree 3 GF(256) equation solver. The degree 3 GF(256) equation solver encompasses the degree 2 GF(256) equation solver since there is an auxiliary degree 2 equation that must be solved. The roots of a fourth degree error location polynomial are determined using a degree 4 GF(256) equation solver that encompasses the degree 3 GF(256) equation solver and the degree 2 GF(256) equation solver. When the degree 4 GF(256) equation solver utilizes the degree 2 GF(256) equation solver, the two roots need not be distinct. The mathematical basis for each of these equation solvers is described below.

The key equation solver computes the error locator polynomial $\Lambda(x)=1+a_1x+a_2x^2+a_3x^3+a_4x^4$. The degree of $\Lambda(x)$ is $i \leq 4$, where i is the largest integer such that $a_i \neq 0$. It is the intent of the error location polynomial solver to compute the reciprocals of the roots of $\Lambda(x)$. The reciprocals are elements of GF(256) that correspond to error locations. Therefore, when $a_4 \neq 0$, the error location polynomial solver solves the equation $x^4+a_1x+ax^2+ax+a_4=0$ (degree 4 GF(256) equation solver). When $a_4=0$ and $a_3 \neq 0$, the error location polynomial solver solves the equation $x_3+a_1x^2+a_2x+a_3=0$ (degree 3 GF(256) equation solver). When $a_4=a_3=0$ and $a_2 \neq 0$, the error location polynomial solver solves the equation $x^2+a_1x+a_2=0$ (degree 2 GF(256) equation solver). When $a_4=a_3=a_2=0$ and $a_1 \neq 0$, the error location polynomial solver solves the equation $x+a_1=0$. Again, if the appropriate number of roots do not exist, the error pattern is not correctable. The polynomial equations that are solved are monic (i.e., the highest order coefficient is one).

Degree 1 GF(256) Equation Solver

If $p(x)=x+a_1$, then the only root of $p(x)$ is $a_1$.

Degree 2 GF(256) Equation Solver

The degree 2 GF(256) equation solver receives a polynomial $p(x)=x^2+bx+c$ with b, c ∈ GF(256). The objective of the degree 2 GF(256) equation solver is to determine if $p(x)$ has two non-zero roots in GF(256) and if so, to compute those roots. In addition, the degree 3 GF(256) equation solver and the degree 4 GF(256) equation solver utilize the degree 2 GF(256) equation solver. The degree 2 GF(256) equation solver is used by the degree 4 GF(256) equation solver to determine 2 roots whereas the degree 3 GF(256) equation solver utilizes the degree 2 GF(256) equation solver to find a single non-zero root.

In an embodiment of the present invention, the degree 2 GF(256) equation solver can utilize the technique described in E. R. Berlekamp, H. Rumsey, G. Solomon, "On the Solution of Algebraic Equations over Finite Fields", Information and Control 10, 553–564 (1967), which is hereby incorporated by reference as background information. The following discussion briefly describes this technique.

There are two cases that the degree 2 GF(256) equation solver considers: (1) the case where the input polynomial is of the form $p(x)=x^2+c$, where b=0 (this can occur when the degree 4 GF(256) equation solver utilizes the degree 2 GF(256) equation solver); and (2) the case where the input polynomial is of the form $p(x)=x^2+bx+c$. In the first case, the two roots are identical (i.e., $c^{1/2}$, $c^{1/2}$) whereas in the second case, the two roots are distinct.

For the first case, there is a unique solution in GF($2^n$) and this solution can be found by computing the square root of c. The square root of c can be determined by representing c in terms of a fixed basis of GF($2^n$), namely $u_1, u_2, \ldots, u_n$, as $c=\Sigma_{i=1}^{n}c_iu_i$. The square root of c is then $c^{1/2}=\Sigma_{i=1}^{n}c_i(u_i)^{1/2}$. Furthermore $u_i^{1/2}$ can be represented in terms of this same basis as $u_i^{1/2}=\Sigma_j R_{ij} u_j$, with $R_{ij}\Sigma$ GF(2). Accordingly, $$\sqrt{c} = \sum_{j=1}^{n} \left\{ \sum_{i=1}^{n} c_i R_{i,j} \right\} u_j$$

In characteristic 2, there is no analogue of the quadratic formula. To find the solutions of $x^2+bx+c=0$, the degree 2 equation solver solves an equation of the form: $x^2+x+d=0$, where $d=c/b^2$. This polynomial will have roots in $GF(2^n)$ if and only if the trace $Tr(d)=0$, that is, if and only if $d+d^2+d^4+\ldots+d^r=0$, where $r=2^{n-1}$. This occurs for exactly half the elements $d \in GF(2^n)$. For $GF(2^n)$ generated over $GF(2)$ by an element $\alpha$, the elements of $GF(2^n)$ can be written as polynomials $a_0 a_1\alpha+a_2\alpha^2+\ldots a_{n-1}\alpha^{n-1}$, where $a_i=0$ or 1 for $0 \leq i \leq n-1$. The map $x \to x^2+x$ is $GF(2)$-linear and M is the matrix representing this map with respect to the usual basis $\beta=\{1, \alpha, \alpha^2, \ldots, \alpha^{n-1}\}$. The jth column of M contains the coordinates of $(\alpha^{j-1})^2 + \alpha^{j-1}$ with respect to $\beta$. Thus, if $x=x_0 x_1 \alpha + \ldots + x_{n-1}\alpha^{n-1}$, and $x^2+x=d_0 d_1\alpha+\ldots +d_{n-1}\alpha^{n-1}$, then $$M \cdot (x_0, x_1, \ldots, x_{n-1})^\tau.$$

Since $x^2+x=0$ only if $x=0$ or $x=1$, the nullity of M is 1 and, hence, the rank of M is $n-1$. Thus, there is a $n \times n$ matrix N such that $$N \cdot M = \begin{pmatrix} 0 & 1 & 0 & 0 & \ldots & 0 & 0 \\ 0 & 0 & 1 & 0 & \ldots & 0 & 0 \\ 0 & 0 & 0 & 1 & \ldots & 0 & 0 \\ \vdots & \vdots & \vdots & \vdots & \ddots & \vdots & \vdots \\ 0 & 0 & 0 & 0 & \ldots & 1 & 0 \\ 0 & 0 & 0 & 0 & \ldots & 0 & 1 \\ 0 & 0 & 0 & 0 & \ldots & 0 & 0 \end{pmatrix}$$

If $x^2+x=d$, then $N \cdot M (x, x_1, \ldots, x_{n-1}) = N \cdot (d_0, d_1, \ldots, d_{n-1})^T$ and therefore $(x_0, x_1, \ldots, x_{n-1}, 0)^T = N \cdot (d_0, d_1, \ldots, d_{n-1})^T$. Thus, $x^2+x=d$ has solutions if and only if the dot product of the nth row of N with the coordinates of d equals 0. This product is in fact the trace of d. The coordinates $x_1, \ldots, x_{n-1}$ are given by the above matrix product and the coordinate $x_0$ can be either 0 or 1. This gives the coordinates of the two roots of $x^2+x=d$.

The determination of the root of the polynomial is determined by first defining $x_1, x_2, \ldots, x_{n-1}$ by the above matrix product $N \cdot (d_0, d_1, \ldots, d_{n-1})^T$ and taking x0 to be $Tr(d)$, where $Tr(d)$ is computed as the product of the nth row of N with d. Thus, when $x_0=1$, $x^2+x+d=0$ has no roots in $GF(2^n)$ and when $x_0=0$, then $x_0, x_1, x_2, \ldots, x_{n-1}$ are the coordinates of a root $r_1$ of the equation and $r_2=r_1+1$. To solve $x^2+bx+c=0$, we compute a root r of $x^2+x+c/b^2=0$ and then the roots of the original equation $p(x)$ are br, br+b. If $x^2+x+c/b^2=0$ has no roots in $GF(2^n)$, then neither does $x^2+bx+c=0$.

Degree 3 GF(256) Equation Solver

The degree 3 GF(256) equation solver receives an input polynomial $p(x)=x^3+bx^2+cx+d$ with b, c, d $\in$ GF(256). The objective of the degree 3 GF(256) equation solver is to determine if $p(x)$ has three distinct non-zero roots in GF(256) and if so, to compute those roots. Only input polynomials with $d \neq 0$ are considered by the degree 3 GF(256) equation solver and the solver will terminate if the polynomial has multiple roots or roots lying outside of GF(256). The polynomial $p(x)$ has multiple roots precisely when its discriminant vanishes. Since the discriminant is $(bc+d)^2$, $p(x)$ has multiple roots if and only if $bc+d=0$. The degree 3 GF(256) equation solver utilizes a degree 2 GF(256) equation solver.

The degree 3 GF (256) equation solver is used by the degree 4 GF(256) equation solver to find a single non-zero root. In this case, the degree 3 GF(256) solver determines this particular root as will be explained in more detail below.

The solver relies on classical techniques that have been used for the solution in radicals of cubic polynomials with real number coefficients. In an embodiment of the present invention, the degree 3 GF(256) equation solver is based on the "cubic" technique presented in B. L. van de Waerden, *Algebra*, Vol. 1, Section 8.8, Frederick Ungar Publishing Co., New York, pages 187–189, which is hereby incorporated by reference as background information. The degree 3 GF(256) equation solver has modified this cubic technique to accommodate the GF(256) finite field and to produce a root finding algorithm for cubic polynomials with coefficients in the finite field GF(256) and to provide an efficient circuit implementation.

The degree 3 equation solver then proceeds to determine the roots of $p(x)$ as follows. Let $x_0$, $x_1$, $x_2$ be the roots of $p(x)=x^3+bx^2+cx+d$, so that $p(x)=(x-x_0)(x-x_1)(x-x_2)$ and let $\omega \in GF(256)$ be a primitive cube root of unity ($\omega$ is a precomputed constant). The Lagrange resolvents $r_0$, $r_1$, and $r_2$ are defined as $r_0=x_0+x_1+x_2=b$ $r_1=x_0+\omega x_1+\omega^2 x_2$ $r_2=x_0+\omega^2 x_1+\omega x_2$ Thus, $(r_0, r_1, r_2)$ is the discrete Fourier transform of $(x_0, x_1, x_2)$. The roots $x_i$ of $p(x)$ can be expressed in terms of $r_i$ via an inverse Fourier transform:

$x_0=r_0+r_1+r_2$ $x_1=r_0+\omega^2 r_1+\omega r_2$ $x_2=r_0+\omega r_1 \omega^2 r_2$ The first step is to compute the cubes of $r_1$ and $r_2$. Note that $r_1 r_2=b^2+c$ and let $R_1=r^3_1$ and $R_2=r^3_2$. Then $R_1+R_2=bc+d$ and $R_1 R_2=(b^2+c)^3$, so that $R_1$ and $R_2$ are the roots of the quadratic polynomial $f(X)=X^2+(bc+d)X+(b^2+c)^3$. Thus, the coefficients of $f(X)$ may be obtained from the coefficients of $q(x)=p(x+b)=x^3+(b^2+c)x+(bc+d)=x^3+c_1 x+c_0$. Again, if $c_0=0$, then $p(x)$ has multiple roots and failure is reported. There are two cases that need to be considered: the "pure cubic" case where $c_1=0$ and the "generic cubic" case where $c_1 \neq 0$.

In the pure cubic case, $q(x)=x^3+c_0$ and $p(x)$ has three roots in GF(256) if and only if $c_0$ has a cube root $\delta \in GF(256)$. In this case, the three cube roots of $c_0$ are $\delta$, $\delta\omega$, and $\delta\omega^2=\delta+\delta\omega$ and the roots of $p(x)$ are $\delta+b$, $\delta\omega+b$, and $\delta\omega^2+b$.

In the generic cubic case, $c_0$ and $c_1$ are non-zero, hence, the roots of $f(X)$ are both non-zero. Since $\omega \in GF(256)$, then $r_1, r_2, R_1, R_2 \in GF(256)$ whenever $x_0, x_1, x_2 \in GF(256)$. Thus, if $f(X)$ does not have two roots in GF(256), then $p(x)$ does not have three roots in GF(256). On the other hand, if $f(X)$ has roots $\alpha, \beta \in GF(256)$, then $\alpha$ and $\beta$ have cube roots in GF(256) whenever $x_0, x_1, x_2 \in GF(256)$. Thus, if $\alpha$ does not have a cube root in GF(256), then $p(x)$ does not have three roots in GF(256). On the other hand, if $\alpha$ has a cube root A, then A differs from either $r_1$ or $r_2$ by multiplication by a cube root of unity. Reordering the roots $x_0, x_1, x_2$ if necessary, we may assume $A=r_1$. In this case, $r_2=(b^2+c)/r_1$. The values of $r_1$ and $r_2$, are known as well as $r_0=b$, so that the roots $x_i$ can be computed from the second set of equations above.

From the point of view of logic design, it is desirable to have one procedure that treats both the pure cubic and generic cubic cases. Fortunately, the algorithm used in the generic case also handles the pure cubic case: If $c_1=0$, then $f(X)=X^2+(bc+d)X$ and if $\alpha$ is the non-zero root $bc+d$, then $r_1$ is a cube root of bc+d and $r_2$=0. Thus, the equations expressing the $x_i$ in terms of the $r_i$ will produce the desired answer so that the procedure that treats the generic cubic case also treats the pure cubic case.

Degree 4 GF(256) Equation Solver

The degree 4 GF(256) equation solver receives an input polynomial p(x) that can be represented as $p(x)=x^4+bx_3+cx^2+dx+e$ with b, c, d, e $\in$ GF(256). An objective of the degree 4 GF(256) equation solver is to determine if p(x) has four distinct non-zero roots in GF(256) and if so, to compute those roots. Only error location polynomials with e≠0 are considered by the degree 4 GF(256) equation solver and the solver will terminate if the polynomial has multiple roots or roots lying outside of GF(256). The degree 4 GF(256) equation solver utilizes a degree 3 GF(256) equation solver and a degree 2 GF(256) equation solver.

The solver relies on classical techniques for the solution in radicals of quartic polynomials with real number coefficients. In an embodiment of the present invention, the degree 4 GF(256) equation solver is based on the "quartic" technique presented in B. L. Van de Waerden, *Algebra*, Vol. 1, Section 8.8, Frederick Ungar Publishing Co., New York, pages 190–192, which is hereby incorporated by reference as background information. The degree 4 GF(256) equation solver has modified this quartic technique to accommodate the GF(256) finite field and to produce a root finding algorithm for quartic polynomials with coefficients in the finite field GF(256) and to provide an efficient circuit implementation.

The degree 4 equation solver proceeds to determine the roots of p(x) as follows. Let $x_1$, $x_2$, $x_3$, $x_4$ be the roots of $p(x)=x^4+bx^3+cx^2+dx+e$ so that $p(x)=(x-x_1)(x-x_2)(x-x_3)(x-x_4)$. The three quantities $\theta_1$, $\theta_2$, and $\theta_3$ are defined as follows:

$\theta_1=(x_1+x_2)(x_3+x_4)$ $\theta_2=(x_1+x_3)(x_2+x_4)$ $\theta_3=(x_1+x_4)(x_2+x_3)$ The $\theta_i$ are invariant under the Klein 4-group $V_4S_4$ and are the roots of the following cubic equation: $q(x)=x+(bd+c^2)x+(bcd+b^2e+d^2)=0$. Now $\theta_1$, $\theta_2$, $\theta_3$ $\in$ GF(256) whenever $x_1$, $x_2$, $x_3$, $x_4$ GF(256). Thus, if q(x) does not have all its roots in GF(256), then neither does p(x). Furthermore, the discriminant disc(p)=$(bcd+b^2e+d^2)^2$ must be non-zero if p(x) has distinct roots. When bcd+$b^2$e+$d^2$+0, then q(x) has distinct roots. polynomials will either produce the four roots of p(x) or show that p(x) does not have four roots in GF(256).

The foregoing discussion has focused on the theoretical aspects of the various equation solvers embodied in the error location polynomial solver. Attention now turns to the system architecture and circuitry that implements these equation solvers.

System Architecture

Figure 2:
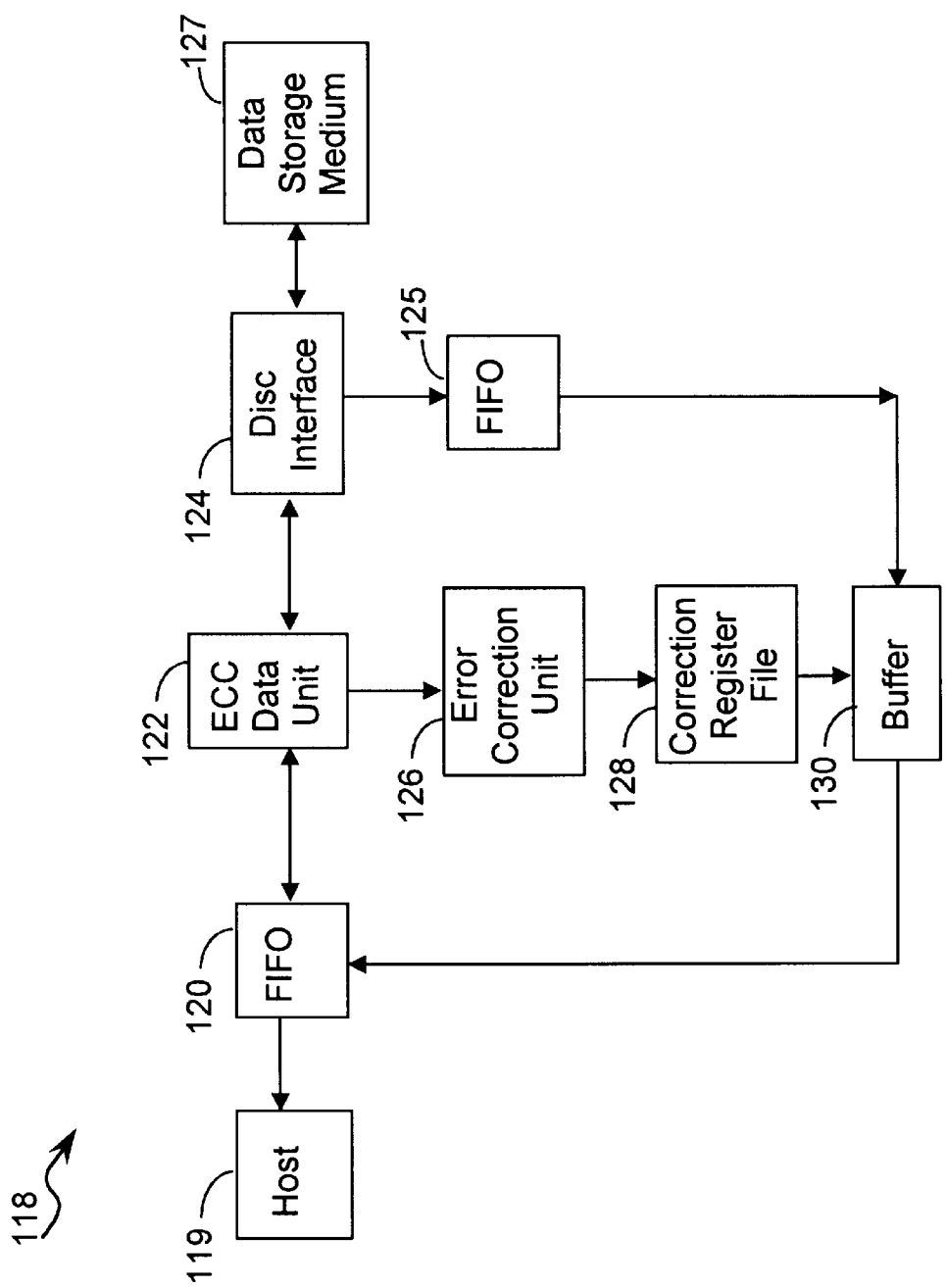
FIG. 2 is a block diagram illustrating the components of the data storage system embodying the present invention.

FIG. 2 illustrates a data storage system 118 that embodies the present invention. A host computer system 119 reads data from a data storage medium 127 and writes data to the data storage medium 127. A first FIFO 120 is used to temporarily store the data that is transferred between the host and the data storage system 118. When the host 119 writes data to the data storage medium 127, the user data stored in FIFO 120 is transmitted to the error correction coder (ECC) data unit 122 that appends parity bytes to user data. The encoded data is written to the data storage medium by the disc interface 124.

Data that is to be read from a data storage medium is read by the disc interface 124 and transferred to the buffer 130 through FIFO 125. In addition, the read data and parity data is transmitted to the ECC data unit 122. The ECC data unit 122 computes the syndromes for the read data which are transmitted to the error correction unit 126. The error correction unit 126 computes the error locations and values which are written into a correction register file 128. The data in the buffer 130 is corrected using the error location and values stored in the correction register file 128 which is then transmitted to a host via FIFO 120.

Figure 3:
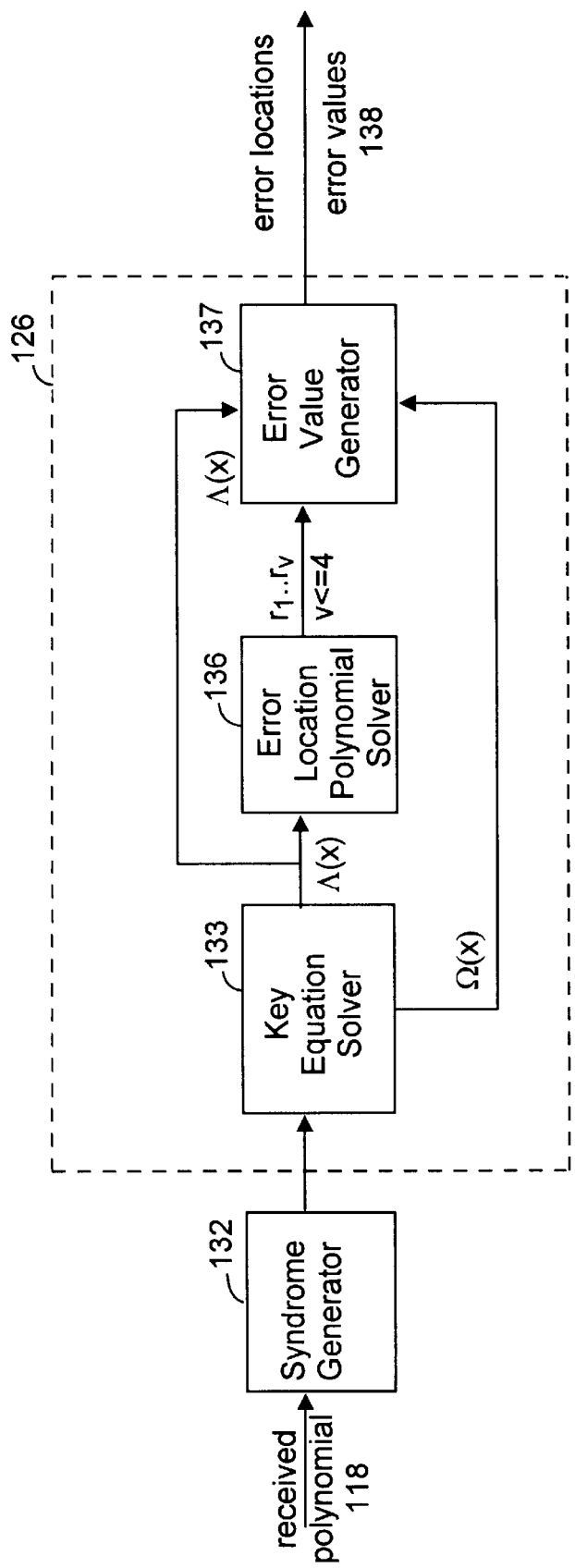
FIG. 3 illustrates the error correction system of the present invention.

FIG. 3 illustrates a portion of the components used to decode encoded data. A received polynomial 118 is transmitted to a syndrome generator 132. The syndrome generator 132 calculates each of the 2t syndromes from the given received polynomial 118. The syndrome generator 132 can utilize any of the well-known techniques for generating syndromes such as but not limited to Horner's algorithm. The syndrome generator 132 transmits the syndromes to a key equation solver 133. The key equation solver 133 utilizes the received syndromes to determine the coefficients of the error location polynomial $\Lambda(x)$ and the error magnitude polynomial $\Omega(x)$. The key equation solver 133 can utilize any of the well-known RS decoding techniques to determine these coefficients, such as but not limited to the Berlekamp-Massey algorithm, Euclid's algorithm, and the like. In an embodiment of the present invention, the key equation solver 133 uses the Berlekamp-Massey algorithm. Thus, the output of the key equation solver 133 is the error location polynomial $\Lambda(x)$ and the error magnitude polynomial $\Omega(x)$.

The error location polynomial $\Lambda(x)$ is transmitted to the error location polynomial solver 136. The error location polynomial $\Lambda(x)$ consists of four 8-bit coefficients, $a_1$, $a_2$, $a_3$, $a_4$. The error location polynomial solver 136 determines at most four roots ($r_1$, . . . $r_v$, where v<4). These roots are transmitted to the error value generator 137 along with the error location polynomial $\Lambda(x)$ and error magnitude polynomial $\Omega(x)$. The error value generator 137 utilizes the error location $\Lambda(x)$ and error magnitude polynomial $\Omega(x)$ to determine the error values and the error locations 138. In an embodiment of the present invention, the error value generator 137 can utilize Forney's algorithm. The error values and error locations 138 are then transmitted to the correction register file 126 in order for subsequent processing to correct the encoded data.

Figure 4:
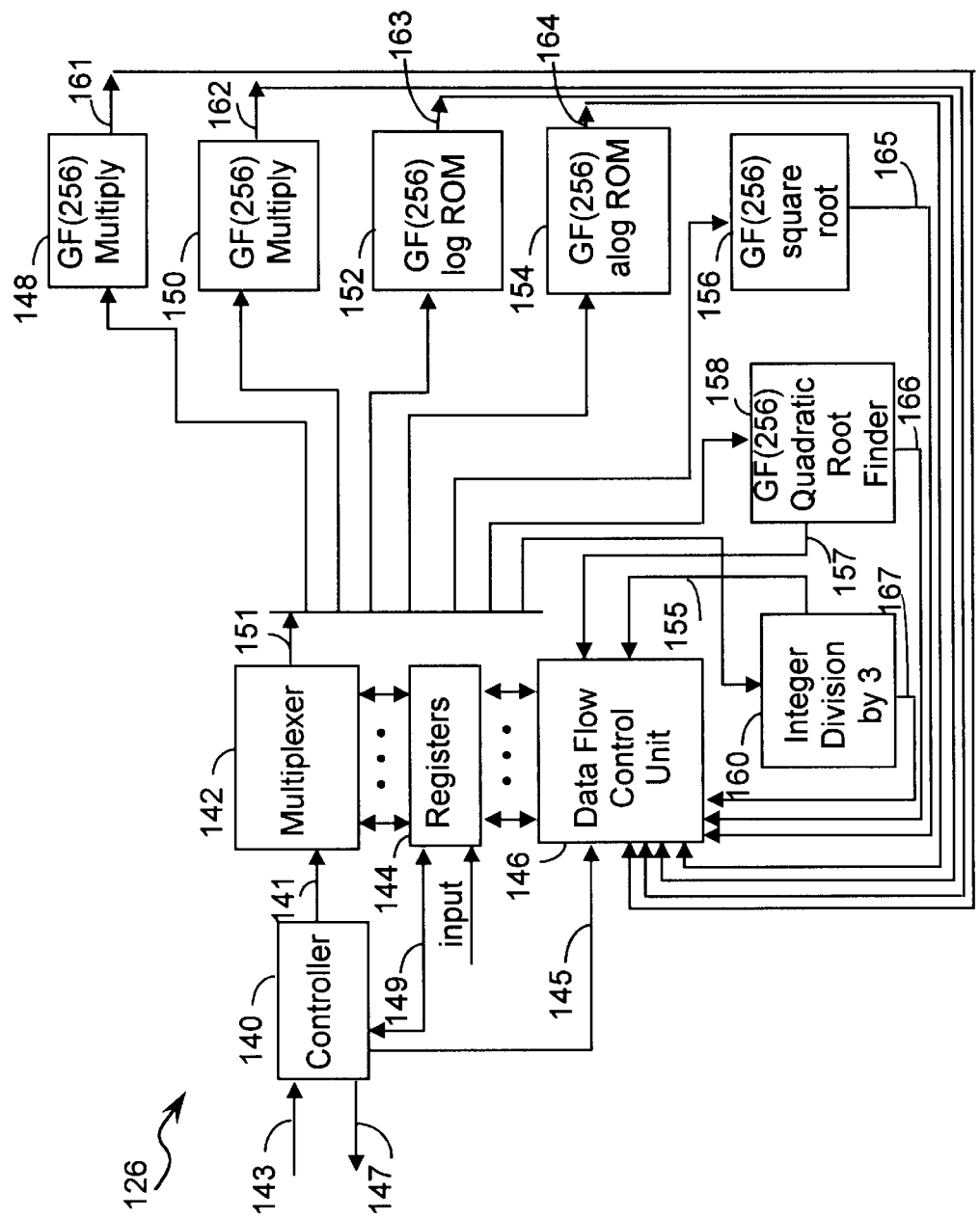
FIG. 4 illustrates the components of the error location polynomial solver of FIG. 3.

FIG. 4 illustrates the components of the error location polynomial solver 136. The solver 136 includes a controller 140, a data flow control unit 146, storage registers 144, multiplexor 142, and a number of specialized arithmetic modules 148–160. The controller 140 is used to direct the various processing units to perform various functions that implement the equation solver described above. In an embodiment of the present invention, the controller 140 can be implemented as a state machine. It would be obvious to one skilled in the art to implement the operation of the controller 140 described below as a state machine.

The various arithmetic components and registers of the error location polynomial solver 136 are used not only to determine the reciprocals of the field elements corresponding to the error positions but also to determine the error values, the coefficients for the error location polynomial, and the coefficients for the error magnitude polynomial. In an embodiment of the present invention, the state machine controls each of these tasks. By utilizing these same components and registers for each of these functions, the present invention reduces the amount of circuitry needed to perform these functions. In the prior art (see FIG. 1), the same fuinctions were performed utilizing two separate units 104 and 105 which require separate arithmetic components and registers. In the present invention, the same circuitry 126 is used to determine the error positions, error values, and coefficients of the error magnitude polynomial and error location polynomial.

Several registers 144 are used to store the error location polynomial coefficients, error magnitude coefficients, and intermediate results used in the calculation of the error positions. Initially, the coefficients are transmitted to solver 136 and stored in the registers 144. The registers 144 are coupled to a multiplexor 142. The multiplexor 142 is used to select data stored in one or more registers 144 and to transmit the selected data to an appropriate arithmetic module 148–160. The multiplexor 142 is under the control of the controller 140 which transmits a signal 141 that directs the multiplexor to perform an intended data transfer to one or more of the various arithmetic modules 148–160.

The data flow control unit 146 is used to direct the outputs of the various arithmetic modules 148–160. The data flow control unit 146 is coupled to the registers 144, the controller 140, and the various arithmetic modules 148–160. The data flow control unit 146 receives a signal 145 from the controller 140 that signifies an intended action that is to be performed. In response to the signal 145, the data flow control unit 146 receives output data and signals transmitted from one or more of the arithmetic modules 148–160. The data flow control unit 146 stores this data into one or more registers 144. In addition, the data flow control unit 146 can perform simple operations (e.g., exclusive-or operation) on the data stored in the registers 144.

The controller 140 is coupled to the multiplexor 142, registers 144, and the data flow control unit 146. The controller 140 is activated by a start signal 143. The controller is able to read the registers 144 in order to determine the appropriate signals that should be transmitted to direct the data flow control unit 146 and the multiplexor 142 in the calculation of the roots. The controller 140 transmits signal 145 directing how the data flow control unit 146 is to process the received outputs. The controller 140 also transmits signal 141 which directs the multiplexor 142 to transmit data stored in one or more registers to an intended arithmetic module 148–160. At the completion of the error location polynomial solver 136, the controller 140 transmits a completion signal 147 that signifies the completion of the solver procedures.

The solver 136 includes two GF(256) multiply modules 148, 150, each of which performs a GF(256) multiplication operation. GF(256) multiply modules 148, 150 are well known in the art and any of the well-known GF(256) multiplication techniques can be used. Each GF(256) multiply module 148, 150 receives two 8-bit inputs from the multiplexor 142. Each 8-bit result is then transmitted to data flow control unit 146 via a corresponding signal 161, 162. The GF(256) logarithmic (log) ROM 152 maps all field elements in GF(256) into powers of $\beta$. The elements of GF(256) are represented by an 8-bit binary vector. Each non-zero 8-bit vector S corresponds to a unique integer i ($0 \leq i \leq 254$) which can be regarded as its logarithm to the base $\beta$. Thus, the GF(256) log ROM 152 is used to map a non-zero 8-bit vector S into i. The log ROM 152 stores a table of GF(256) logarithms that are used to perform this mapping. The log ROM 152 receives an input signal 151 representing S and generates an output signal 163 representing an integer i, where $i = \log_\beta S$.

Conversely, the GF(256) anti-logarithm (alog) ROM 154 is used to map an integer i into the corresponding power of $\beta^i$. Thus, the alog ROM 154 receives an input signal 151 representing an integer i and generates an output signal 164 representing S, an element of GF(256), where $S = \beta^i$. The alog ROM 154 stores a table of GF(256) anti-logarithms that are used to perform this mapping.

The GF(256) square root module 156 receives an input signal 151 representing an element in GF(256). The GF(256) square root module 156 generates a signal 165 representing the corresponding GF(256) square root. There are several well-known techniques for determining a GF(256) square root and any of these techniques can be utilized. In an embodiment of the present invention, a linear algebra technique is utilized. In this embodiment, the square root y is computed by matrix multiplication in accordance with the following mathematical relation: $P \cdot (x_0, x_1, \ldots x_{n-1})^T = (y_0, y_1, \ldots y_{n-1})^T$, where P is a n×n matrix representing the GF(2)-linear map $x \rightarrow x^{1/2}$ with respect to the usual basis $\{1, \alpha, \alpha^2, \ldots, \alpha^{k-1}\}$, $x = x_0 + x_1\alpha + \ldots + x_{n-1}\alpha^{n-1}$, and $x^{1/2} = y_0 + y_1\alpha + \ldots + y_{n-1}\alpha^{n-1}$.

The GF(256) quadratic root finder module 158 determines a root of the quadratic polynomial $x^2 + x + d = 0$. The GF(256) quadratic root finder module 158 receives the input signal representing d and returns to the data flow control unit 146 a respective root 165 and a one-bit flag 157 that indicates whether the root is valid. A situation may arise where a quadratic may not have a root. In this case, the calculated root 165 is invalid and the one-bit flag 157 indicates this. A typical such situation is the case of an uncorrectable error pattern.

The division by 3 module 160 implements integer division by 3. The integer division by 3 module 160 receives an 8-bit signal 151 from the multiplexer 142 representing an integer k in where $0 \leq k \leq 255$ and returns two outputs to the data flow control unit 146. The first output is an 8-bit signal 167 representing the value k|3 when k is divisible by 3 and the second output is a 1-bit signal 155 indicating whether element k is divisible by 3.

The integer division by 3 module 160 determines this division in the following manner. First, the computation m=171k (mod 256) is performed. The inverse of 3 mod (256) is 171. Next, the value of m is compared to 85 in order to determine if k is divisible by 3. If $m \leq 85$ (i.e., 255/3), then k is divisible by 3 and the value k/3 is returned to the data flow control unit 146 via signal 167 and the valid flag 155 is set.

The foregoing description has described the circuitry used to support the error location polynomial solver. Attention now turns to the manner in which reciprocals are calculated and the manner in which cube roots are determined. Both of these calculations are used throughout the various equation solver computations and minimize the circuitry needed to perform their associated functions and hence, the overall error location polynomial solver circuitry.

GF(256) Reciprocal Computation

The error location polynomial solver 136 utilizes a special technique to determine the reciprocal of an element of GF(256). In RS codes, error locations are identified by elements of the finite field GF(256). A primitive element $\beta \in$ GF(256) is fixed and the correspondence between field elements and error locations can be represented by the following mathematical relation: if $\alpha = \beta^k$, then $\alpha$ corresponds to the error location k, where k is referred to as the discrete logarithm (log) of $\alpha$ and $\alpha$ is called the anti-logarithm (antilog) of k. The logarithms and anti-logarithms are computed via a lookup table. In addition, reciprocals can be calculated using only log and antilog lookup tables.

The reciprocal for an element α in GF(256) can be determined in accord with the following mathematical relation: $1/\alpha=1/\beta^k=\beta^{255}/\beta^k=\beta^{255-k}$=antilog (255−k). This relation is implemented in the following steps. First, the value k=log(α) is computed from a lookup table of logarithms. Next, the reciprocal 1/α is determined by taking the one's complement of k which is denoted as $\bar{k}$ ($\bar{k}$=255−k). The anti-logarithm of $\bar{k}$ is determined from a lookup table of anti-logarithms yielding the reciprocal 1/α.

Figure 5:
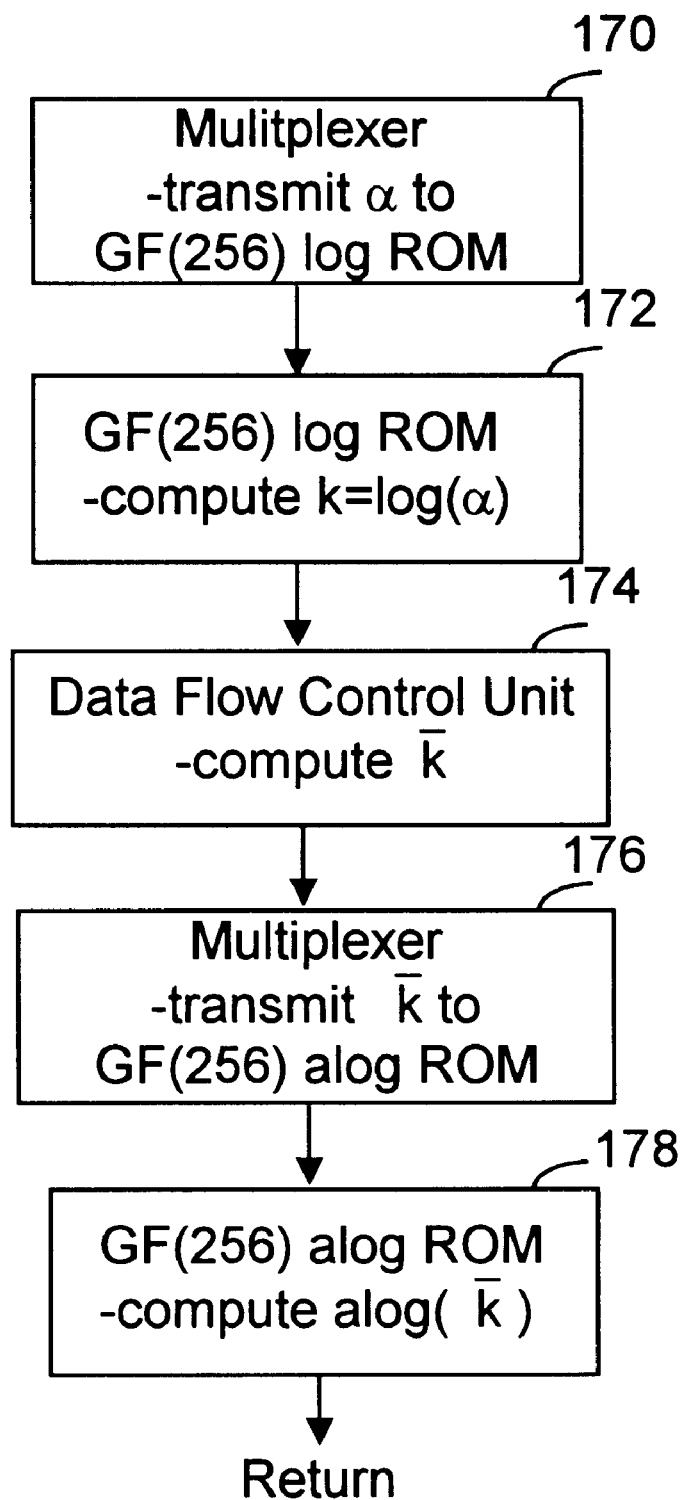
FIG. 5 illustrates the steps used in determining the reciprocal of an element of GF(256).

FIG. 5 illustrates the steps used by the error location polynomial solver 136 to compute the reciprocal of a field element a in GF(256). Referring to FIGS. 4–5, the controller 140 sends a signal 141 to the multiplexer 142 that enables the multiplexer 142 to transmit the data in register 144 representing the 8-bit value of a to the GF(256) log ROM 152 (step 170). The GF(256) log ROM 152 performs a table lookup for the log(s) represented as k which is transmitted through signal 163 to the data flow control unit 146. The data flow control unit 146 stores k in register 144.

Next, controller 140 transmits signal 145 to the data flow control unit 146 directing it to read the value of k from register 144 and to take the one's complement of this data thereby producing $\bar{k}$. The one's complement of k is generated by inverting the bits of k (step 174). The controller 140 also transmits signal 141 to the multiplexer 142 which instructs the multiplexer 142 to transmit the value of $\bar{k}$ to the GF(256) alog ROM 154 (step 176). The GF(256) alog ROM 154 performs a table lookup operation to obtain the anti-log ($\bar{k}$) which is the reciprocal 1/α. The GF(256) alog ROM 154 transmit the reciprocal through signal 164 to the data flow control unit 146 which stores it in an appropriate register 144 (step 176).

The computation of the reciprocal of a GF(256) element in this manner is advantageous in several respects. It utilizes existing logarithm and anti-logarithm tables rather than requiring an additional lookup table for reciprocals.

GF(256) Cube Root Computation

The error location polynomial solver 136 utilizes a special technique to determine the cube root of an element in GF(256). The cube root computation utilizes the logarithmic and anti-logarithmic tables as well as the division by 3 module 160.

Figure 6:
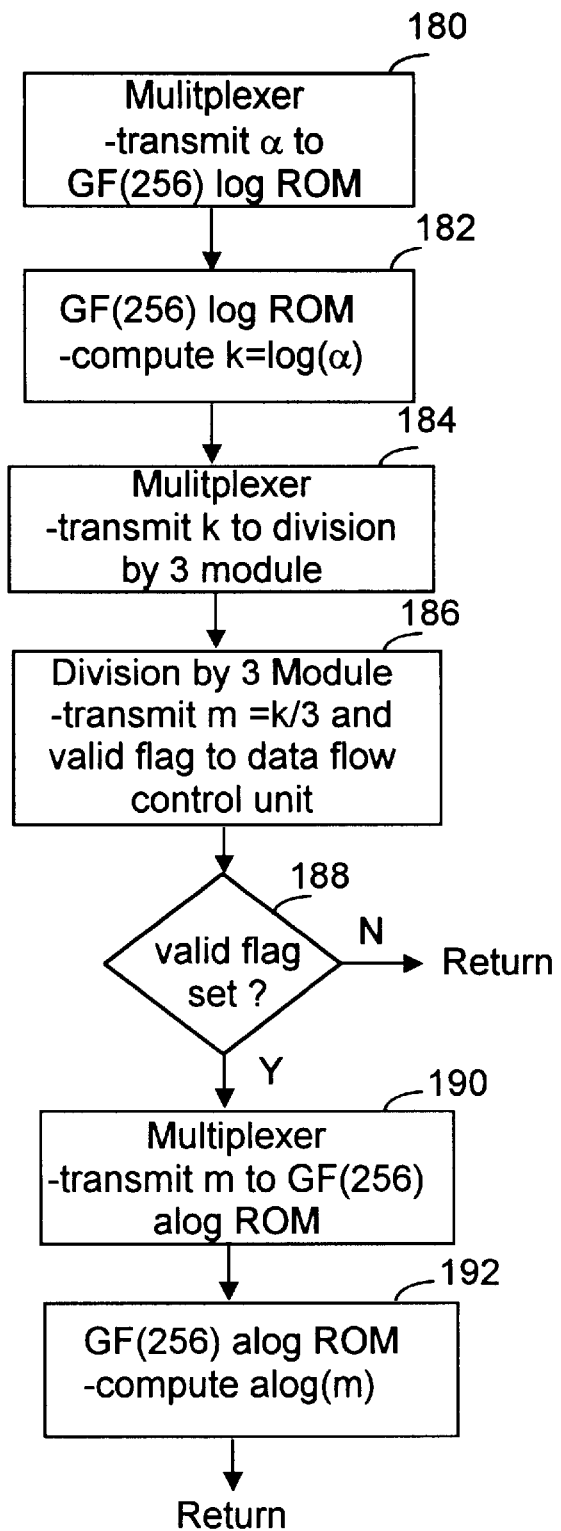
FIG. 6 illustrates the steps used in determining cube roots of an element of GF(256).

The procedure entails the following steps illustrated in FIG. 6. Referring to FIGS. 4 and 6, the controller 140 sends a signal 141 to the multiplexer 142 that enables the multiplexer 142 to transmit the data in register 144 representing the 8-bit value of a to the GF(256) log ROM 152 (step 180). The GF(256) log ROM 152 performs a table lookup for the log(α) represented as an integer k which is transmitted through signal 163 to the data flow control unit 146 (step 182). The data flow control unit 146 stores k in register 144 (step 182).

Next, controller 140 transmits signal 141 to the multiplexer 142 directing it to read the value of k from register 144 and to transmit k to the division by 3 module 160 (step 184). The division by 3 module 160 generates two output signals: signal 155, a one-bit flag that when set indicates that k is divisible by 3; and signal 167 which represents the value k/3. These signals are received by the data flow control unit 146 which stores the value m=k/3 and the valid flag 155 in register 144 (step 186). The controller 140 tests the valid flag 155 (step 188). If the valid flag 155 is not set (step 188-N), the procedure terminates. Otherwise (step 188-Y), the controller 140 transmits a signal 141 to the multiplexer 142 to transmit m to the GF(256) alog ROM 154 (step 190). The GF(256) alog ROM 154 performs a table lookup operation with the value of m thereby generating the antilog(m) which is transmitted as signal 164 to the data flow control unit 146 (step 192). The data flow control unit 146 transfers the cube root, antllog(m), to an appropriate register 144 (step 192).

The foregoing cube root procedure can be easily modified to compute n-th roots, where n is any divisor of 255. The procedure is modified by utilizing a "division by n" module that determines if k is divisible by n by computing m=y·k (mod 256), wherey is the inverse of n (mod 256). Then if m≦255/n, then k is divisible by n.

The computation of the cube root of a GF(256) element in this manner is advantageous in several respects. It utilizes existing logarithm and anti-logarithm tables that are used for other calculations. The table lookup operations minimize the amount of additional circuitry needed to perform this arithmetic function (i.e., an additional lookup table is not required for cube roots).

The foregoing description has described the circuitry used to support the error location polynomial solver. Attention now turns to a more detailed description of the steps used by the error location polynomial solver in determining the roots of the error location polynomial Λ(x).

Operation

FIGS. 7–9 are flow charts of the operation of the error location polynomial solver 136. The controller 140 receives the error location polynomial Λ(x) in the form of a 32-bit word where each 8-bit symbol represents a certain coefficieAt of the polynomial. The error location polynomial can be represented in accordance with the following mathematical relation: $\Lambda(x)=1+a_1x+a_2x^2+a_3x^3+a_4x^4$, where the coefficients $a_1$, $a_2$, $a_3$ and $a_4$ are each 8-bit wide and form the 32-bit word that is stored in register 144 (step 200). The controller 140 initially determines the degree of the received error location polynomial (step 202). The controller 140 tests the 8bits representing the coefficient $a_4$ to determine if it is non-zero. If so, then the received error location polynomial is of degree 4. If not, the controller 140 tests whether the 8-bits representing the coefficient $a_3$ are non-zero. If so, then the received error location polynomial is of degree 3. If not, the controller 140 tests whether the 8-bits representing the coefficient $a_2$ are non-zero. If so, the received error location polynomial is of degree 2. If not, the received error location polynomial is of degree 1. It should be noted that if the syndromes had all been zer₀, the error location polynomial would be Λ(x)=1 which is of degree 0.

For the case where the controller 140 determines that the received error location polynomial is of degree 1, the value of $a_1$ is returned (step 204). When the controller 140 determines that the received error location polynomial is of degree 2, the degree 2 equation solving procedures are initiated. Likewise, for a degree 3 error location polynomial, the controller 140 initiates the degree 3 error location polynomial solving procedures. For the case where the controller 140 has received a degree 4 error location polynomial, the degree 4 error location polynomial solving procedures are initiated by the controller 140.

Degree 2 GF(256) Equation Solver Procedures

Figure 8A:
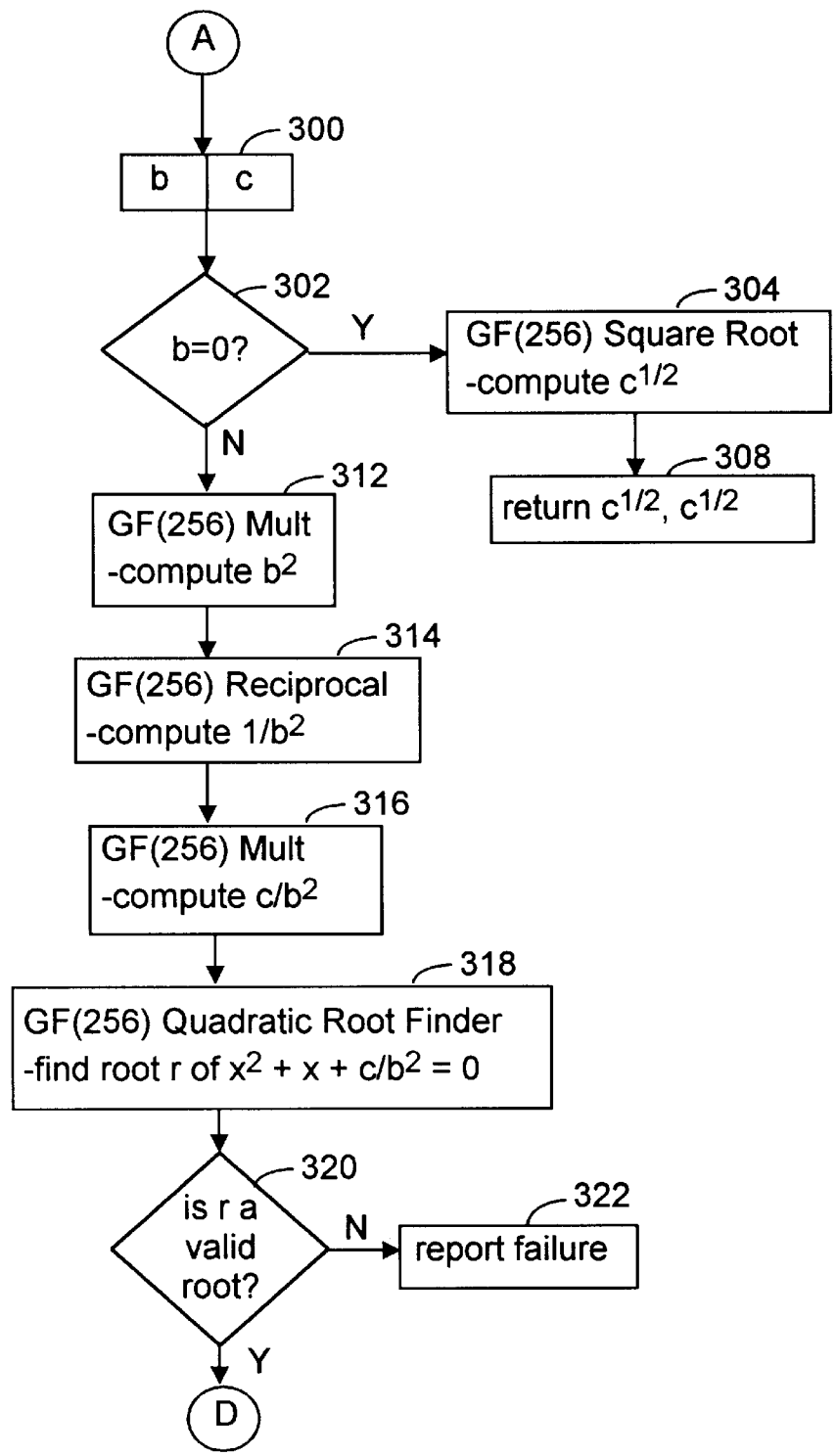
FIGS. 8A–8B illustrate the steps used by the error location polynomial solver in determining the roots of a degree 2 polynomial in an embodiment of the present invention.
Figure 8B:
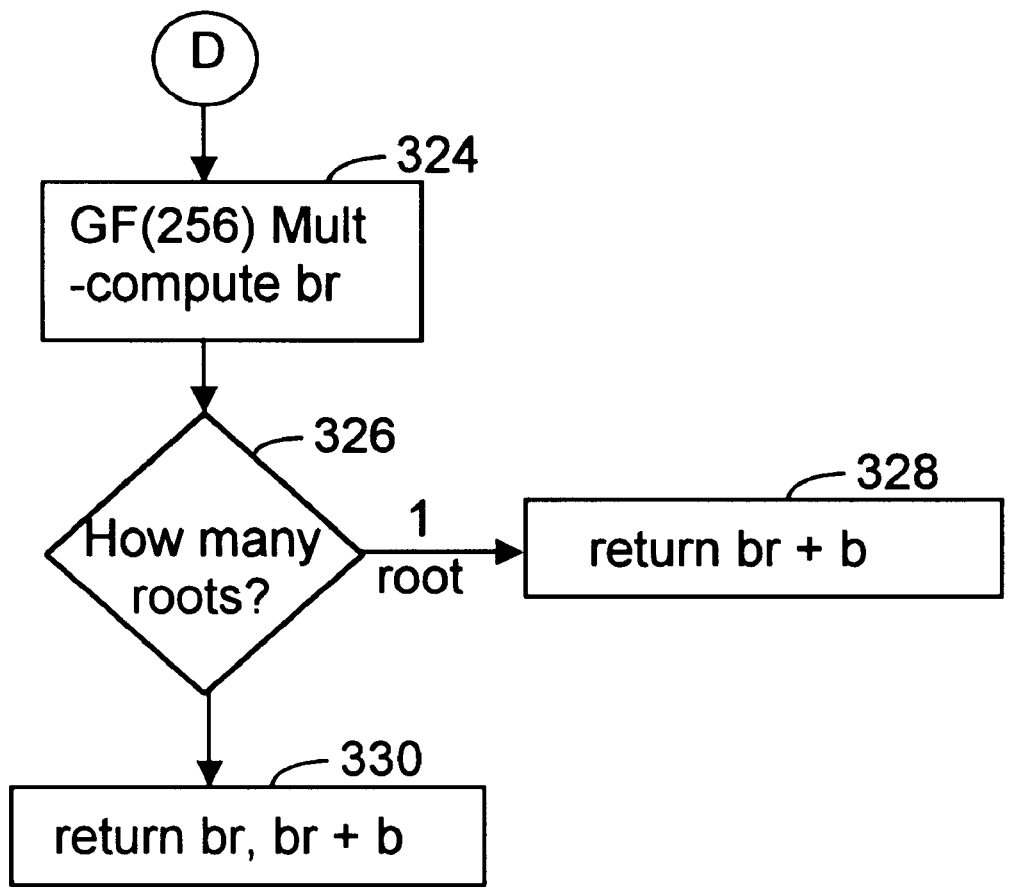

FIGS. 8A–8B illustrates the steps used by the error location polynomial solver unit 136 to determine the two roots of an input quadratic polynomial. The degree 2 GF(256) equation solver procedures are utilized by the degree 3 GF(256) equation solver to find a single non-zero root to a particular quadratic polynomial and by the degree 4 GF(256) equation solver to find two roots to certain quadratic polynomials. The degree 2 GF(256) equation solver procedures will find two roots of the quadratic polynomial of the form: $x^2+bx+c=0$.

Initially, a first register 144 will contain the coefficient b and a second register 144 will contain the coefficient c (step 300). The controller 140 will read the value of b in register 144 and test if b is equal to zero (step 302). If b=0 (step 302-Y), the controller transmits signal 141 to the multiplexer 142 instructing the multiplexer 142 to transmit the value of c to the GF(256) square root module 156. The GF(256) square root module 156 generates a root which is transmitted as signal 165 to the data flow control unit 146. The data flow control unit 146, under control of the controller 140, will store the results in a corresponding register 144 (step 304, 308).

If the controller 140 determines that the value of b≠0, the controller 140 transmits signal 141 to the multiplexer 142 which indicates that the multiplexer 142 is to transmit the value of b in a register 144 to the GF(256) multiply module 148 twice as successive input signals 151. The GF(256) multiply module 148 generates the product $b^2$ which is transmitted via signal 161 to the data flow control unit 146 (step 312). The data flow control unit 146, under the control of the controller 140, stores the value $b^2$ in an intended register 144. Next, the controller 140 proceeds to transmit the appropriate signals to the data flow control unit 146 and the multiplexer 142 to generate the reciprocal $1/b^2$. The steps used by the controller 140 are those that were discussed above previously with respect to FIG. 5 (step 314).

The controller 140 then transmits signal 141 to the multiplexer 142 indicating that the values of c and $b^2$ stored in registers 144 are to be transmitted via signal 151 to GF(256) multiply module 148. The GF(256) multiply module 148 generates the product $c/b^2$ which is transmitted via signal 161 to the data flow control unit 146 which stores it in an intended register 144 (step 316). The controller 140 transmits signal 141 to the multiplexer 142 indicating that the multiplexer 142 is to transmit the value $c/b^2$ to the GF(256) root finder module 156.

The GF(256) root finder module 156 determines a single non-zero root to the quadratic equation: $x^2+x+c/b^2=0$. The GF(256) root finder module 156 will transmit via signal 158 the root, denoted as $r_1$ and a valid signal 157 which will indicate whether the root is valid (step 318). Both of these signals are received by the data flow control unit 146 which stores them into appropriate registers 144. The controller 140 tests if the valid signal 157 is set (step 320). If the valid signal 157 is not set (step 320-N), the controller 140 will report a failure (step 322). This is typically done by setting an external signal. Otherwise (step 320-Y), the root r is valid.

The controller 140 then transmits signal 141 to the multiplexer 142 indicating that the multiplexer 142 is to transmit the values of b and r stored in registers 144 to the GF(256) multiply module 148 (step 324). The GF(256) multiply module 148 determines the product br which is transmitted via signal 161 to the data flow control unit 146 (step 324). The data flow control unit 146, under control of the controller 140, will add (i.e., exclusive-or) the contents of the register storing the value br with the contents of the register storing b, and store the sum br+b into an intended register 144. If the degree 2 GF(256) equation solver is being performed as part of a degree 3 GF(256) equation solver (i.e., only one root is needed) (step 326), the controller 140 will utilize only one root, br+b (step 328). Otherwise (step 326), the controller 140 will store the two roots in two registers 144 representing br+b and br respectively (step 330).

Degree 3 Equation Solver Operation

Figure 9A:
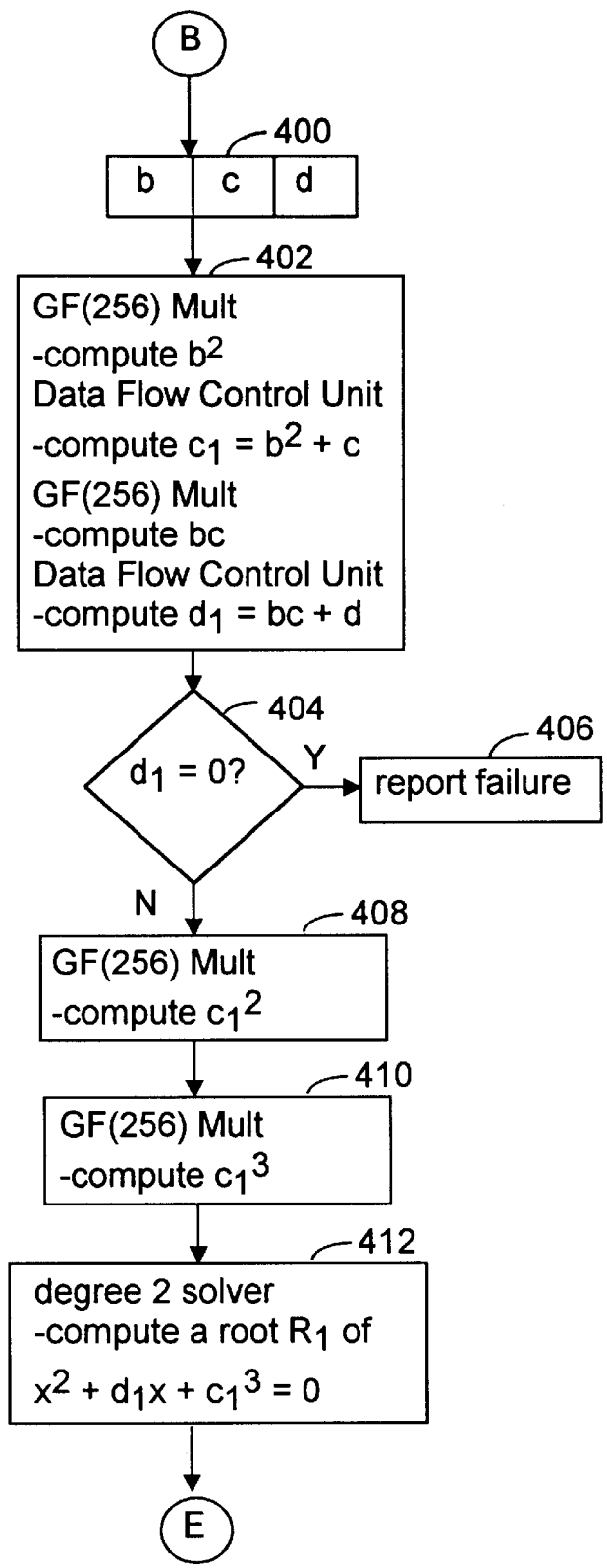
FIGS. 9A–9B illustrate the steps used by the error location polynomial solver in determining the roots of a degree 3 polynomial in an embodiment of the present invention.
Figure 9B:
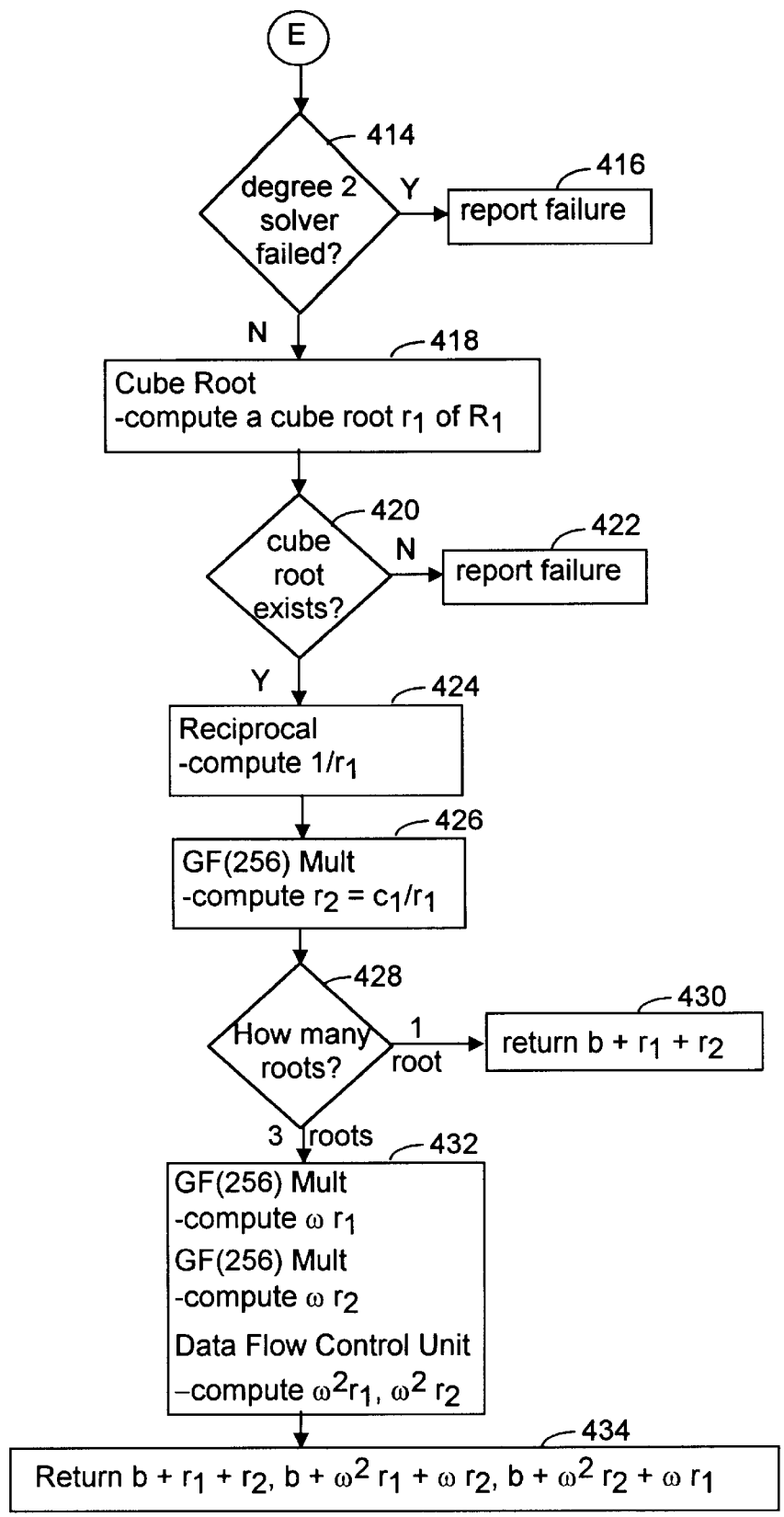

FIGS. 9A–9B illustrates the steps used by the error location polynomial solver unit 136 to determine the three roots of a cubic polynomial. In addition, the degree 3 GF(256) equation solver procedures are utilized by the degree 4 GF(256) equation solver to find a single non-zero root. In either case, the degree 3 equation solver will compute either one non-zero root or three distinct roots to the polynomial $p(x)=x^3+bx^2+cx+d$ with coefficients in GF(256).

The polynomial q(x) is generated where $q(x)=p(x+b)=x^3+c_1x+d_1$, $c_1=b^2+c$ and $d_1=bc+d$. The degree 3 equation solver then attempts to solve the quadratic $f(X)=X^2+(bc+d)X+(b^2+c)^3=0$. If f(X) has no roots in GF(256), then the degree 3 equation solver reports failure: p(x) does not have three roots in GF(256). Otherwise, let $R_1 \in$ GF(256) be a non-zero root of f(X).

Next, the degree 3 equation solver attempts to compute a cube root of $R_1$. If $R_1$ does not have a cube root in GF(256), then the degree 3 equation solver reports failure: p(x) does not have three roots in GF(256). Otherwise, $r_1 \in$ GF(256) is a cube root of $R_1$. The value $r_2=(b^2+c)/r_1$ is computed. The degree 3 equation solver returns $b+r_1+r_2$, $b+\omega^2 r_1+\omega r_2$, $b+\omega r_1+\omega^2 r_2$ as the three roots.

The error location polynomial solver 136 implements this technique in the following manner. Initially, a first register 144 will contain the coefficient b, a second register 144 will contain the coefficient c, and a third register 144 will contain the coefficient d (step 400). The controller 140 will send a signal 141 to the multiplexer 142 indicating that the multiplexer 142 is to transmit to GF(256) multiply 148 the multiplicands b and b stored in register 144 and to transmit to GF(256) multiply 150, the multiplicands b and c stored in registers 144 (step 402). The GF(256) multiply 148 transmits via signal 161 the product $b^2$ to the data flow control unit 146 and the GF(256) multiply 150 transmits via signal 162 the product bc to the data flow control unit 146.

The data flow control unit 146, under the control of the controller 140, receives the product $b^2$ and adds (i.e., exclusive-or) it to the value of c stored in a respective register 144 and stores the sum, $c_1=b^2+c$, in an intended register 144 (step 402).

The data flow control unit 146, under the control of the controller 140, receives the product bc and adds (i.e., exclusive-or) it to the value of d stored in a respective register 144 and stores the sum, $d_1=bc+d$, in an intended register 144 (step 402).

The controller 140 then reads the value of d, from the register 144 to determine if the value of $d_1=0$ (step 404). If $d_1=0$ (step 404-Y), the controller 140 will report a failure (step 406). This is typically done by setting an external signal.

Otherwise (step 404-N), the controller 140 transmits to multiplexer 142 a signal 141 indicating that the multiplexer 142 is to transmit the value of $c_1$ stored in register 144 twice as two multiplicands to GF(256) multiply 148 (step 408). The GF(256) multiply 148 computes the product $c_1^2$ and transmits the product via signal 161 to the data flow control unit 146. The data flow control unit 146 stores the product $c_1^2$ in an intended register (step 408).

The controller 140 transmits to multiplexer 142 a signal 141 indicating that the multiplexer 142 is to transmit the value $c_1$ stored in register 144 and the value $c_{12}$ to GF(256) multiply 148 (step 410). The GF(256) multiply 148 computes the product $c_1^3$ and transmits the product via signal 161 to the data flow control unit 146 (step 410). The data flow control unit 146 stores the product $c_1^3$ in an intended register (step 410).

Next, the controller 140 initiates the steps used by the degree 2 equation solver with the values of $d_1$ and $c_1^3$ to find a non-zero root $R_1$ of the quadratic equation $x^2+d_1x+c_1^3$ (step 412). The steps used to determine the root $R_1$ were described above with respect to FIGS. 8A–8B. The root $R_1$ is stored in an appropriate register 144 (step 412).

If the quadratic solver failed (step 414-Y), the controller 140 reports the failure (step 416). Otherwi'se (step 414-N), the controller 140 performs the above mentioned steps with regard to the determination of a cube root (see FIG. 6) to determine the cube root $r_1$ of $R_1$ (step 418). If no such cube root exists (step 420-N), then the controller 140 reports the failure (step 422). Otherwise (step 420-Y), if a cube root exists the controller 140 performs the above mentioned steps with regard to the determination of a reciprocal (see FIG. 5) to determine the reciprocal $1/r_1$ (step 424). The reciprocal $1/r_1$ is stored in a register 144. The controller 140 then instructs the multiplexer 142 through signal 141 to transmit the values $c_1$ and $1/r_1$ to the GF(256) multiply 148 (step 426). The GF(256) multiply 148 computes the product $r_2=c_1/r_1$ which is transmitted via signal 161 to the data flow control unit 146 (step 426). The data flow control unit 146 stores the value of $r_2$ in a corresponding register 144 (step 426).

For the case where the degree 3 equation solver is being performed to obtain one root (step 428), the controller 140 instructs the data flow control unit 146 through signal 145 to compute the root $b+r_1+r_2$ by adding the values stored in the corresponding registers 144 (step 430). The sum is stored in an intended register 144 (step 430).

For the case where there are three roots (step 428), the controller 140 instructs the multiplexer 142 to transmit the values of $\omega$ and $r_1$ stored in registers 144 to GF(256) multiply 148 (step 432). The value of $\omega$ is constant and stored in register 144. The value of $\omega$ represents the cube root of unity. In addition, the multiplexer 142 is instructed to transmit the values of $\omega$ and $r_2$ stored in registers 144 to GF(256) multiply 150 (step 432). The GF(256) multiply 148 generates the product $\omega \cdot r_1$ which is transmitted via signal 161 to the data flow control unit 146 (step 432). The GF(256) multiply 150 generates the product $\omega \cdot r_2$ which is transmitted via signal 162 to the data flow control unit 146 (step 432). The data flow controller receives these signals and forms the product $\omega^2 r_1$ as the sum $\omega r_1+r_1$ and the product $\omega^2 r_2$ as the sum $\omega r_2+r_2$ (step 432). The data flow controller 146, under the direction of the controller 140, computes the following sums which represent the three roots and are then stored in registers 144: $b+r_1+r_2$; $b+\omega^2 r_1+\omega r_2$; and $b+\omega r_1+\omega^2 r_2$ (step 434).

Degree 4 Equation Solver Operation

Figure 7A:
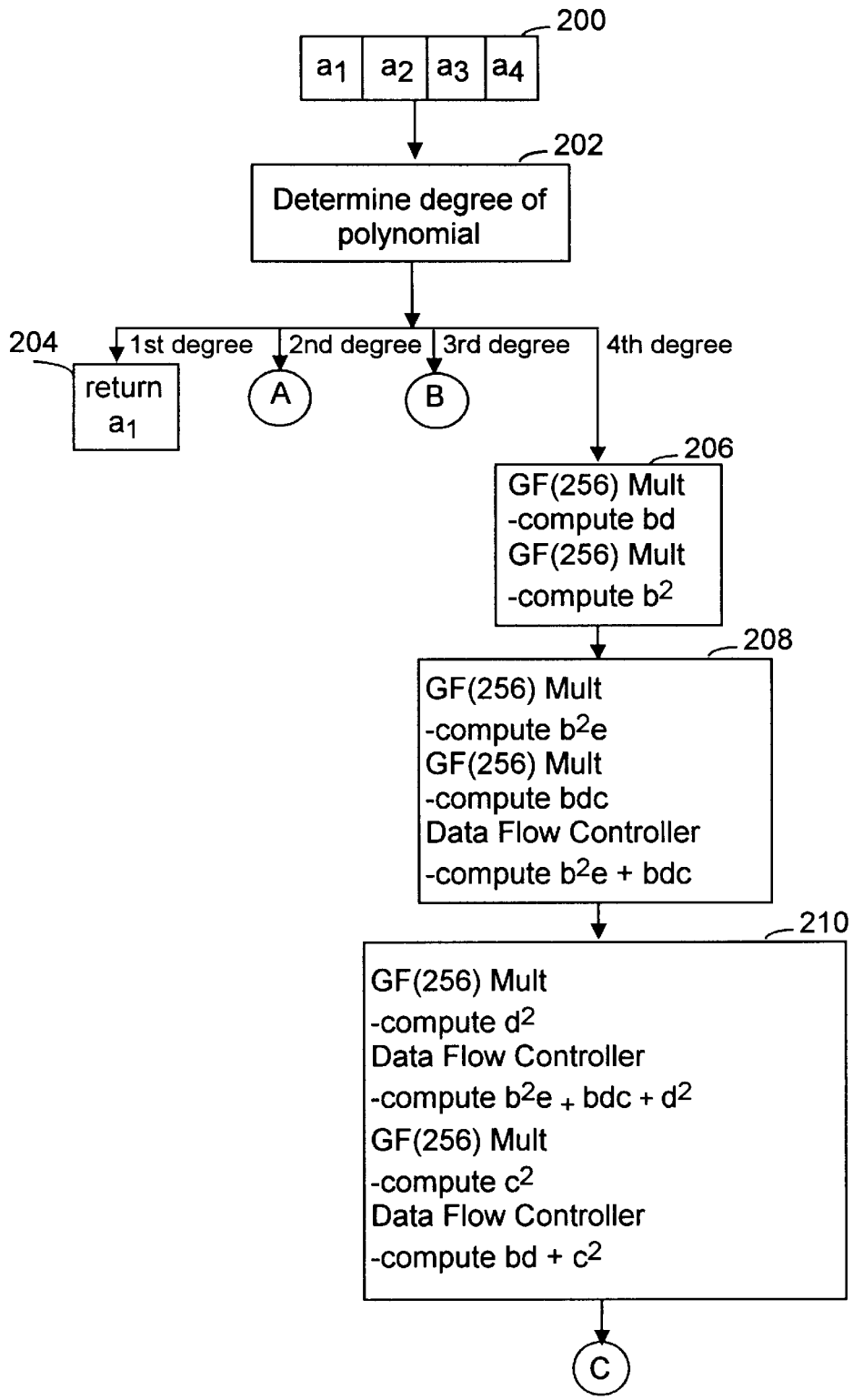
FIGS. 7A–7C illustrate the steps used by the equation location polynomial solver in determining the roots of a degree 4 polynomial in an embodiment of the present invention.
Figure 7B:
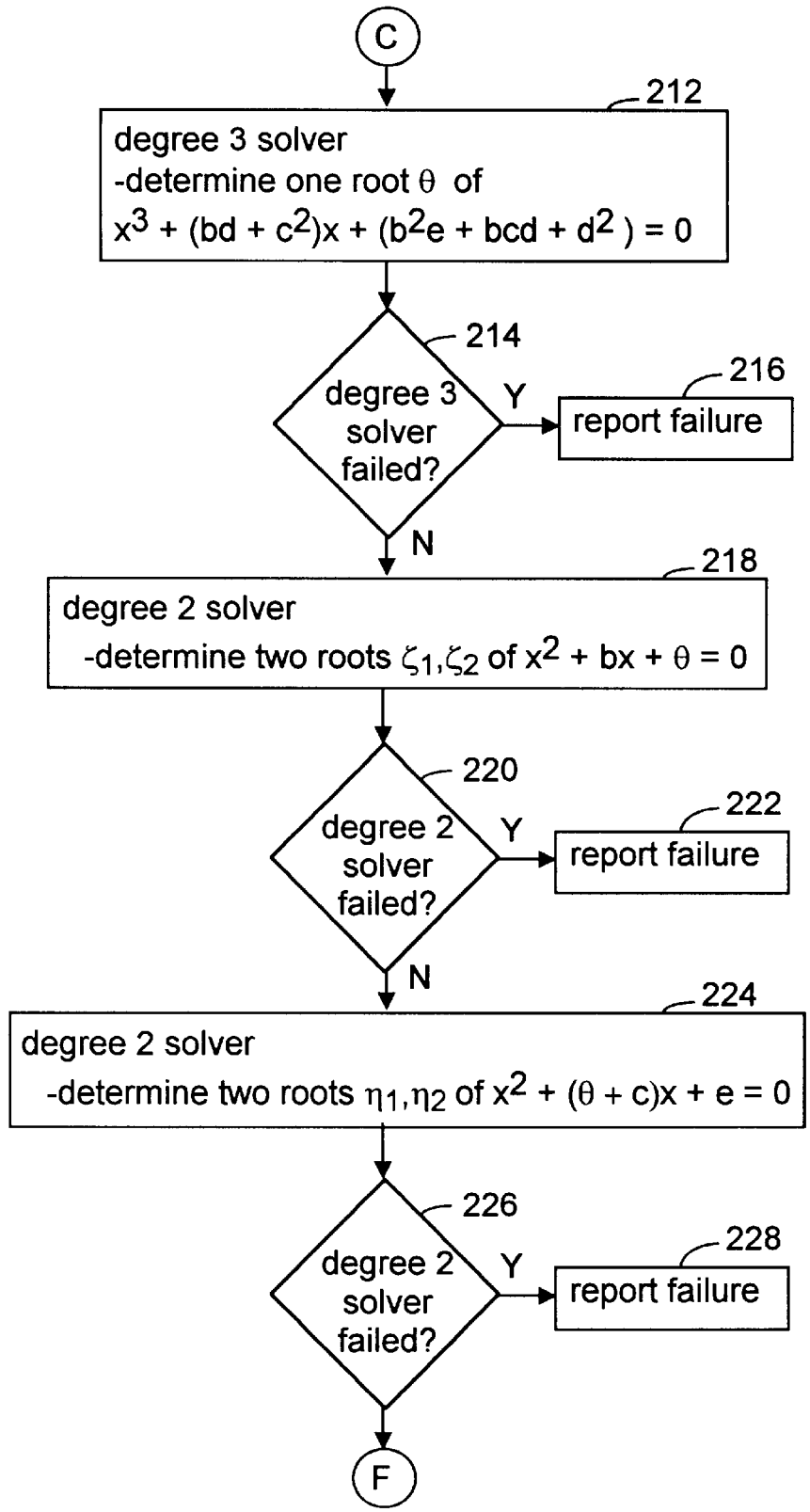
Figure 7C:
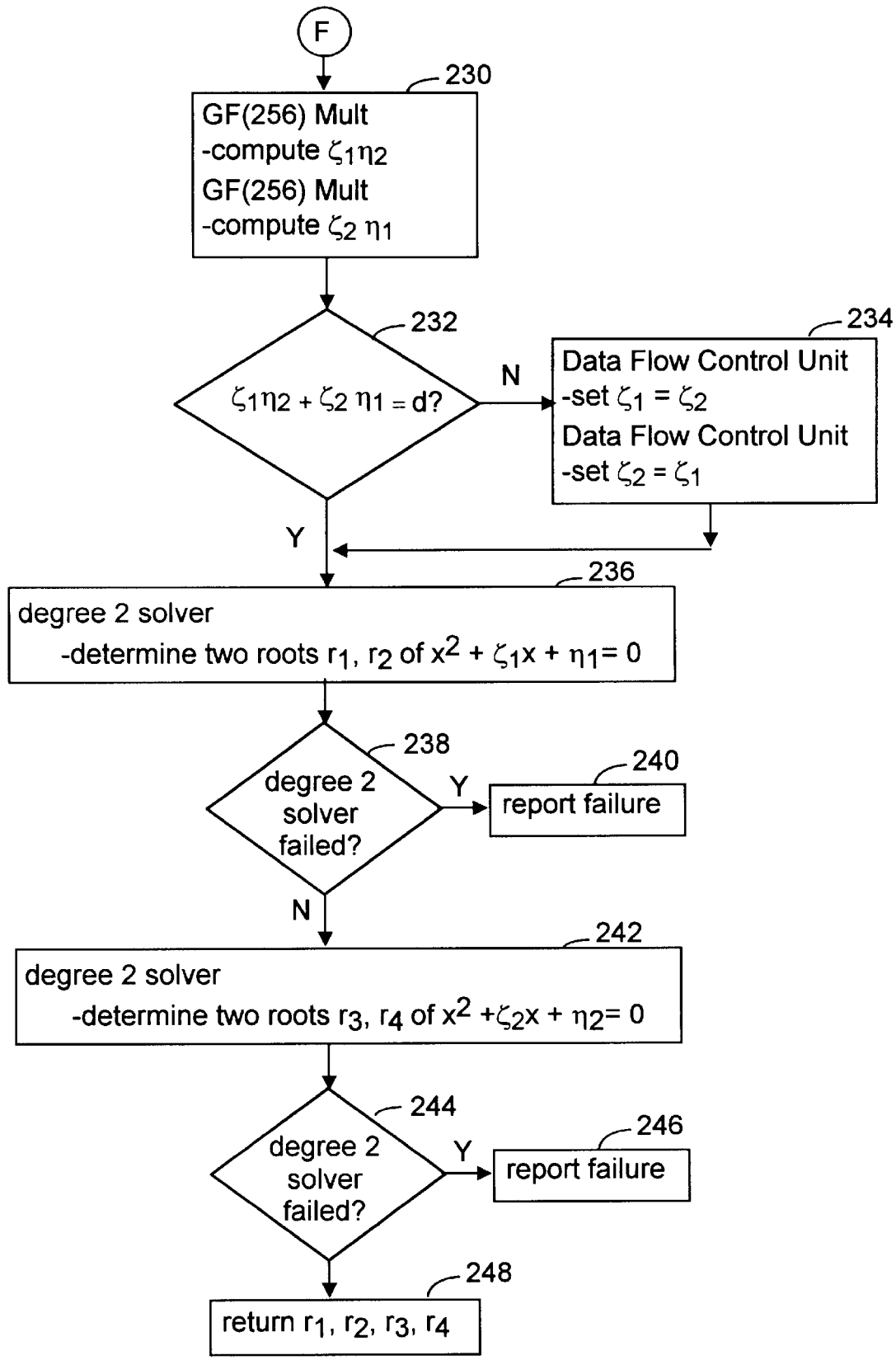

FIGS. 7A–7C illustrates the steps used by the error location polynomial solver unit 136 to determine the four roots of a quartic polynomial. The degree 4 equation solver receives an input polynomial $p(x)=x^4+bx^3+cx^2+dx+e$ with coefficients in GF(256). The polynomial $q(x)$ is generated where $q(x)=x^3+(bd+c^2)x+(bcd+b^2e+d^2)=0$. The degree 3 equation solver is then utilized to find one root $\theta$ of $q(x)$. Next, the degree 4 equation solver utilizes the degree 2 equation solver to find two roots $\zeta_1, \zeta_2$ of the polynomial $x^2+bx+\theta=0$ and to find two roots $\eta_1, \eta_2$ of $x^2+(\theta+c)x+e=0$. These roots are then used to find via the degree 2 equation solver two roots $r_1$ and $r_2$ of the polynomial $x^2+\zeta_1 x+\eta_1=0$ and two roots $r_3$ and $r_4$ of the polynomial $x^2+\zeta_2 x+\eta_2=0$. The roots of the error location polynomial are then $r_1, r_2, r_3$, and $r_4$.

FIGS. 7A–7C illustrate the steps used by the error location polynomial solver 136 to determine the roots of the error location polynomial represented as $x^4+bx^3+cx^2+dx+e=0$. Initially, the values of b (i.e., $a_2$), c (i.e., $a_2$), d (i.e., $a_3$), e (i.e., $a_4$), are stored in registers 144. The controller 140 instructs the multiplexer 142 to transmit the value of b and d to the GF(256) multiply 148 and to transmit the value of b twice to the GF(256) multiply 150 (step 206). The GF(256) multiply 148 forms the product bd which is transmitted via signal 161 to the data flow control unit 146 (step 206). The GF(256) multiply 150 forms the product $b^2$ and transmits the product via signal 162 to the data flow control unit 146 (step 206). The data flow control unit 146 receives these products and stores them in registers 144 (step 206).

The controller 140 then instructs the multiplexer 142 to transmit the values $b^2$ and e to GF(256) multiply 148 and to transmit the values bd and c to GF(256) multiply 150 (step 208). The GF(256) multiply 148 forms the product $b^2e$ which is transmitted via signal 162 to the data flow control unit 146 (step 208). The GF(256) multiply 150 forms the product bdc which is transmitted via signal 162 to the data flow control unit 146 (step 208). The data flow control unit 146, under the control of the controller 140, computes the sum $b^2e+bdc$ and stores this sum in an intended register 144 (step 208).

The controller 140 then instructs the multiplexer 142 to transmit the value d twice to GF(256) multiply 148 and the value c twice to GF(256) multiply 150 (step 210). The GF(256) multiply 148 computes the product $d^2$ which is transmitted via signal 161 to the data flow control unit 146 (step 210). The GF(256) multiply 150 computes the product $c^2$ which is transmitted via signal 161 to the data flow control 146 (step 210). The data flow control unit 146, under the control of the controller 140, computes the sum $b^2e+bdc+d^2$ and the sum $bd+c^2$ which is then stored in registers (step 210). The operands for these computations is found in registers 144.

Next, the controller 140 performs the steps described above with regard to the degree 3 polynomial solver (see FIGS. 9A–9B) to determine one root $\theta$ of the polynomial $x^3+(bd+c^2)x+(bcd+b^2e+d^2)=0$ (step 212). If this root does not exist (step 214-Y), the controller 140 reports failure (step 216). This is typically performed by raising an external signal. If the root exists (step 214-N), the controller 140 performs the steps described above with regard to the degree 2 polynomial solver (see FIGS. 8A–8B) to determine two roots $\zeta_1, \zeta_2$ of the polynomial $x^2+bx+\theta=0$ (step 218). The coefficient b may be zero for this particular polynomial. If these roots do not exist (step 220-Y), the controller 140 reports failure (step 222). Otherwise (step 220-N), the controller 140 performs the steps described above with regard to the degree 2 polynomial solver (see FIGS. 8A–8B) to determine two roots $\eta_1, \eta_2$ of $x^2+(\theta+c)x+e=0$ (step 224). Again, the coefficient $(\theta+c)$ may be zero. If these roots do not exist (step 226-Y), the controller 140 reports failure (step 228).

Otherwise (step 226-N), the controller 140 then instructs the multiplexer 142 to transmit the values $\zeta_1, \eta_2$ from registers 144 to GF(256) multiply 148 and the values $\zeta_2, \eta_2$ to GF(256) multiply 150 (step 230). The GF(256) multiply 148 computes the product $\zeta_1 \cdot \eta_2$ which is transmitted via signal 161 to the data flow control unit 146 (step 230). The GF(256) multiply 150 computes the product $\zeta_2 \cdot \eta_1$ which is transmitted via signal 162 to the data flow control 146 (step 230). The data flow control unit 146, under the control of the controller 140, computes the sum $\zeta_1 \cdot \eta_2+\zeta_2 \cdot \eta_1$ which is then stored in registers 144 (step 230).

The controller 140 then compares whether the sum $\zeta_1 \cdot \eta_2+\zeta_2 \cdot \eta_1$ is equal to d (step 232). If not (step 232-N), the controller 140 instructs the data flow control unit 146 to set the value of $\zeta_1=\zeta_2$ and to set the value of $\zeta_2=\zeta_1$ (step 234).

The procedure continues with the controller 140 performing the steps to execute the degree 2 polynomial solver to determine two roots $r_1$ and $r_2$ of the quadratic polynomial $x^2+\zeta_1 x+\eta_1=0$ (step 236). If these roots do not exist (step 238-Y), the controller 140 reports failure (step 240). Otherwise, the controller 140 performs the steps to execute the degree 2 polynomial solver to determine two roots $r_3$ and $r_4$ of the polynomial $x^2+\zeta_2 x+\eta_2=0$ (step 242). If these roots do not exist (step 244-Y), the controller 140 reports failure (step 246). Otherwise, the roots of the error location polynomial are $r_1, r_2, r_3$, and $r_4$ which reside in registers 144 (step 248).

Alternate Embodiments

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

The present invention has been described with respect to GF(256). However, the present invention is not constrained to this particular GF and has wider application to any GF($2^n$). Furthermore, the present invention is not constrained to the defining polynomial $x^8+x^7+x^3+x^2+1$ and one skilled in the art can easily apply the technology of the present invention to utilize other defining polynomials. In addition, the present invention has been described with respect to data storage devices. However, the present invention has broader application and can be applied to various types of mediums that utilize the RS class of codes.

What is claimed is:

1. A method for error correction in digital transmission using the Reed-Solomon encoding/decoding techniques, said method comprising the steps of:
   a) receiving coded data signals;
   b) calculating syndromes of said coded data signals;
   c) establishing at most four coefficients of an error location polynomial signal;
   d) obtaining at most four coefficients of an error magnitude polynomial signal;
   e) determining at most four error position signals from said error location polynomial signal, said error position signal determination step further comprising the steps of:
      i) determining a degree n of said error location polynomial signal, where $n \leq 4$; and
      ii) utilizing a n-th degree Galois Field (GF) polynomial equation solver to determine at most n error position signals;
   f) providing at most four error magnitude signals; and
   g) utilizing said error magnitude signals and said error position signals to provide an error correction signal to be applied to said coded data signals.

2. The method of claim 1, said step e(ii) further comprising the steps of:
   1) utilizing a second degree Galois Field (GF) polynomial equation solver to determine at most two error position signals when said degree is two;
   2) utilizing a third degree GF polynomial equation solver to determine at most three error position signals when said degree is three; and
   3) utilizing a fourth degree GF polynomial equation solver to determine at most four error position signals when said degree is four.

3. The method of claim 2, said step e(ii)(1) further comprising the step of:
   generating a first error position signal representing br and a second error position signal representing br+b when said second degree GF polynomial equation solver receives an input polynomial signal representing $x^2+bx+c=0$, where r is a root of $x^2+x+c/b^2=0$.

4. The method of claim 2, said step e(ii)(1) further comprising the step of:
   generating a first intermediate root signal representing br when said second degree GF polynomial equation solver receives an input polynomial signal representing $x^2+bx+c=0$, where r is a root of $x^2+x+c/b^2=0$.

5. The method of claim 2, said step e(ii)(1) further comprising the step of:
   generating a first intermediate root signal representing $c^{1/2}$ when said second degree GF polynomial equation solver receives an input polynomial signal representing $x^2+c=0$.

6. The method of claim 5, said step e(ii)(1) further comprising the step of:
   generating a second intermediate root signal representing $c^{1/2}$ when said second degree GF polynomial equation solver receives an input polynomial signal representing $x^2+c=0$.

7. The method of claim 2, said step e(ii)(2) further comprising the steps of:
   receiving an input polynomial signal representing $x_3+bx^2+cx+d=0$;
   utilizing said second degree GF polynomial equation solver to determine a first intermediate root signal $R_1$ of a quadratic polynomial signal representing $x^2+(bc+d)x+(b^2+c)^3=0$;
   determining a cube root signal $r_1$ representing a cube root of said first root signal $R_1$; and
   generating a first intermediate root signal representing $b+r_1+r_2$ where $r_2=c_1/r_1$, $c_1=b^2+c$.

8. The method of claim 7, generating a first error position signal representing $b+r_1+r_2$, a second error position signal representing $b+\omega^2 r_1+\omega r_2$, and a third error position signal $b+\omega r_1+\omega^2 r_2$, where $r_2=c_1/r_1$, $c_1=b^2+c$, and $\omega$ represents a cube root of unity.

9. The method of claim 2, said step e(ii)(3) further comprising the steps of:
   a) receiving an input polynomial signal representing $x^4+bx^3+cx^2+dx+e=0$;
   b) utilizing said third degree GF polynomial equation solver to determine a first intermediate root signal $\theta$ representing a non-zero root of a cubic polynomial $x_3+(bd+c^2)x+(b^2e+bcd+d^2)=0$;
   c) using said second degree GF polynomial equation solver to determine a set of second intermediary root signals $\zeta_1, \zeta_2$ representing two roots of $x^2+bx+\theta=0$;
   d) using said second degree GF polynomial equation solver to determine a set of third intermediary root signals $\eta_1, \eta_2$ representing two roots of $x^2+(\theta+c)x+e=0$;
   e) applying said second degree GF polynomial equation solver to determine a first error position signal $r_1$ and a second error position signal $r_2$ where $r_1$ and $r_2$ represent two roots of $x^2+\eta_1 x+\zeta_1=0$; and
   f) applying said second degree GF polynomial equation solver to determine a third error position signal $r_3$ and a fourth error position signal $r^4$ where $r_3$ and $r_4$ represent two roots of $x^2+\eta_2 x+\zeta_2=0$.

10. The method of claim 1, said step e(ii) further comprising the step of:
   generating a first error position signal representing a coefficient a associated with said error location polynomial signal when said degree is one.

11. The method of claim 9, said step e(ii)(3)(d) further comprising the step of:
   setting $=\zeta_1=\zeta_2$ and $\zeta_2=\zeta_1$ when $\zeta_1\eta_2+\zeta_2\eta_1\neq d$.

12. A Reed-Solomon (RS) Galois Field (GF) error correction apparatus, said apparatus comprising:
   a first memory unit for storing a plurality of $GF(2^n)$ logarithmic values, said first memory unit receiving a first input signal representing an element $\alpha$ of a $GF(2^n)$ field and providing a second output signal representing $\log(\alpha)$;
   a second memory unit for storing a plurality of $GF(2^n)$ anti-logarithmic values, said second memory unit receiving a second input signal representing a value p and providing a second output signal representing antilog (p);
   a plurality of registers for storing data;
   a control unit for controlling a sequence of operations that correct RS encoded data, a subset of said operations used to generate a reciprocal $1/\alpha$ of an element $\alpha$ in $GF(2^n)$, said subset of operations generating a plurality of signals that
   select one of said $GF(2^n)$ elements a stored in a select one of said registers and transmit said selected element $\alpha$ to said first memory unit,
   receive said first output signal representing $k=\log(\alpha)$ and generate a complement of said first signal $\bar{k}$ that is stored in a select one of said registers,
   transmit said complement $\bar{k}$ to said second memory unit, and receive said second output signal representing $1/\alpha=\text{antilog}(\bar{k})$.

13. The apparatus of claim 12, said control unit further comprising:
   a multiplexer for controlling a data path between said registers and said first and second memory units;
   a data flow control unit directing data associated with said output signals for storage in said registers and for performing a complement operation on data stored in select ones of said registers; and
   a state machine transmitting a plurality of first control signals to said multiplexer and a plurality of second control signals to said data flow control unit, said control signals used to execute said sequence of operations to generate said reciprocal.

14. A method for correcting errors in cyclic encoded streams of data elements, said method comprising the steps of:
   providing a data element a in $GF(2^n)$;
   utilizing a first lookup table storing $GF(2^n)$ logarithmic values to determine log ($\alpha$);
   determining an inverse $\bar{k}$ of k,
   using a second lookup table storing $GF(2^n)$ anti-logarithmic values to determine a reciprocal $1/\alpha=\log(\bar{k})$; and
   utilizing said reciprocal to correct errors in said cyclic encoded streams of data elements.

15. An error correction apparatus, said apparatus comprising:
   a first memory unit for storing a plurality of $GF(2^n)$ logarithmic values, said first memory unit receiving a first input signal representing an element a of $GF(2^n)$ and providing a first output signal representing $k=\log(\alpha)$;
   a second memory unit for storing a plurality of $GF(2^n)$ anti-logarithmic values, said second memory unit receiving a second input signal representing a value g and providing a second output signal representing antilog (g);
   a division unit, said division unit for use in determining integer division of k/m, where m is a divisor of $2^{n-1}$, said division unit receiving a third input signal representing k and generating a third output signal representing g=k/m;
   a plurality of registers for storing data;
   a control unit for controlling a sequence of operations that correct encoded data, a subset of said operations used to determine a m-th root of a $GF(2^n)$ element, said subset of operations generating a plurality of signals that
   select one of said $GF(2^n)$ elements a stored in a select one of said registers and transmit said select element a to said first memory unit,
   receive said first output signal representing $k=\log(\alpha)$ and transmit the value k to said division unit,
   utilize said division unit to determine g=k/m, and transmit g to said second memory unit to determine alog(g) representing said m-th root of $\alpha$.

16. The apparatus of claim 15, said control unit further comprising:
   a multiplexer for controlling a data path between said registers and said first and second memory units;
   a data flow control unit directing data associated with said output signals for storage in said registers; and
   a state machine transmitting a plurality of first control signals to said multiplexer and a plurality of second control signals to said data flow control unit, said control signals used to execute said sequence of operations to generate said m-th root of $\alpha$.

17. The apparatus of claim 15, said division unit further comprising:
   a multiplication unit for generating $1=y\cdot k \mod (2^n)$, where y is the inverse of m mod $(2^n)$;
   a comparison unit for determining if $1\leq(2^n-1)/m$; and
   a signal generation unit for generating a fourth output signal representing kEm mod $(2^n)$ when said comparison unit determines that $1\leq(2^n-1)/m$.

18. A Reed-Solomon error correction apparatus, said apparatus comprising:
   a first memory unit for storing a plurality of $GF(2^n)$ logarithmic values, said first memory unit receiving a first input signal representing an element $\alpha$ of $GF(2^n)$ and providing a first output signal representing $k=\log(\alpha)$;
   a second memory unit for storing a plurality of $GF(2^n)$ anti-logarithmic values, said second memory unit receiving a second input signal representing a value g and providing a second output signal representing antilog (g);
   a division unit, said division unit for use in determining integer division of b/m, said division unit receiving a third input signal representing b and generating a third output signal representing b/m;
   a plurality of registers for storing data;
   at least one $GF(2^n)$ multiplication unit, each $GF(2^n)$ multiplication unit generating a fourth output signal representing a $GF(2^n)$ product of two multiplicand input signals;

a GF($2^n$) square root unit for receiving a fifth input signal representing d and generating a fifth output signal representing a GF($2^n$) square root of d;

a GF($2^n$) quadratic root finder unit for determining a single non-zero root e to a quadratic polynomial; and a control unit for controlling a sequence of operations that correct encoded data, a first subset of said operations used to determine error positions.

19. The apparatus of claim 18, said control unit including a second subset of said operations used to determine coefficients of an error location and error magnitude polynomial signals and a third subset of said operations used to determine error values.

20. The apparatus of claim 18, said control unit further comprising:

a multiplexer for controlling a data path between said registers and said first and second memory units, said division unit, said GF($2^n$) multiplication units, said GF(2T) square root unit, and said GF(256) quadratic root finder unit;

a data flow control unit directing data associated with said output signals for storage in said registers; and a state machine transmitting a plurality of first control signals to said multiplexer and a plurality of second control signals to said data flow control unit, said control signals used to execute said sequence of operations to correct encoded data.

* * * * *